(12) United States Patent
Kim et al.

(10) Patent No.: US 10,467,094 B2
(45) Date of Patent: Nov. 5, 2019

(54) METHOD AND APPARATUS FOR PERFORMING DATA RECOVERY IN A RAID STORAGE

(71) Applicant: SAMSUNG ELECTRONICS CO., LTD., Suwon-si, Gyeonggi-do (KR)

(72) Inventors: Sangwoo Kim, Suwon-si (KR); Jungho Yun, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 238 days.

(21) Appl. No.: 15/429,486

(22) Filed: Feb. 10, 2017

(65) Prior Publication Data

US 2017/0255515 A1 Sep. 7, 2017

(30) Foreign Application Priority Data

Mar. 4, 2016 (KR) .................. 10-2016-0026263

(51) Int. Cl.
*G06F 11/10* (2006.01)
*G06F 3/06* (2006.01)
(Continued)

(52) U.S. Cl.
CPC .......... *G06F 11/1068* (2013.01); *G06F 3/065* (2013.01); *G06F 3/0619* (2013.01); *G06F 3/0665* (2013.01); *G06F 3/0689* (2013.01); *G06F 11/108* (2013.01); *G06F 11/1012* (2013.01); *G06F 11/142* (2013.01); *G11C 29/52* (2013.01); *G06F 2201/805* (2013.01); *G06F 2201/85* (2013.01); *G11C 29/021* (2013.01);
(Continued)

(58) Field of Classification Search
CPC ............ G06F 11/1068; G06F 11/1012; G06F 11/108; G06F 11/142; G06F 3/0619; G06F 3/065; G06F 3/0689; G06F 3/0665
See application file for complete search history.

(56) References Cited

U.S. PATENT DOCUMENTS 7,679,133 B2 3/2010 Son et al.
7,984,361 B2 7/2011 Ito
(Continued)

FOREIGN PATENT DOCUMENTS

KR 100496872 B1 6/2005
KR 10-0928882 B1 11/2009
(Continued)

*Primary Examiner* — Yolanda L Wilson
(74) *Attorney, Agent, or Firm* — Volentine, Whitt & Francos, PLLC

(57) ABSTRACT

A recovery method and apparatus for use in a redundant array of independent disks (RAID) storage device is provided that includes a plurality of nonvolatile memory devices. The recovery method includes: reading a data chunk, in which an uncorrectable error occurs, from the plurality of nonvolatile memory devices, selecting a plurality of sub-stripes including a parity and excluding the data chunk, and performing, in parallel, a first recovery operation of adjusting a read level to recover the data chunk and a second recovery operation of processing the plurality of sub-stripes to recover a sub-stripe including the data chunk. The parallel performance of the first and second recovery operations is completed according to an earlier completion of one of the first and second recovery operations.

12 Claims, 16 Drawing Sheets

(51) Int. Cl.
  *G06F 11/14* (2006.01)
  *G11C 29/52* (2006.01)
  *G11C 29/02* (2006.01)
  *G11C 29/00* (2006.01)
  *G11C 29/04* (2006.01)

(52) U.S. Cl.
  CPC ............ *G11C 29/028* (2013.01); *G11C 29/74* (2013.01); *G11C 2029/0409* (2013.01); *G11C 2029/0411* (2013.01)

(56) References Cited

U.S. PATENT DOCUMENTS

| | | | |
|---|---|---|---|
| 8,195,978 B2 | 6/2012 | Flynn et al. | |
| 8,219,887 B2 * | 7/2012 | Pruthi | G06F 11/1076 714/52 |
| 8,539,300 B2 | 9/2013 | Otsuka | |
| 8,553,466 B2 | 10/2013 | Han et al. | |
| 8,559,235 B2 | 10/2013 | Yoon et al. | |
| 8,621,318 B1 | 12/2013 | Micheloni et al. | |
| 8,654,587 B2 * | 2/2014 | Yoon | G11C 16/0483 365/185.18 |
| 8,656,257 B1 | 2/2014 | Micheloni et al. | |
| 8,707,122 B1 | 4/2014 | Micheloni et al. | |
| 8,719,661 B1 | 5/2014 | Gulati et al. | |
| 9,063,880 B2 * | 6/2015 | Kawano | G06F 12/0246 |
| 9,195,541 B2 * | 11/2015 | Lee | G06F 11/1076 |
| 2010/0161883 A1 | 6/2010 | Kurashige | |
| 2011/0233648 A1 | 9/2011 | Seol et al. | |
| 2013/0080830 A1 * | 3/2013 | Won | G11C 16/20 714/15 |
| 2013/0166991 A1 | 6/2013 | Shimada | |
| 2014/0143630 A1 * | 5/2014 | Mu | G06F 11/1048 714/763 |
| 2015/0161004 A1 * | 6/2015 | Camp | G06F 11/1076 714/6.24 |
| 2016/0034355 A1 * | 2/2016 | Sadovsky | G06F 11/142 714/4.3 |
| 2017/0220410 A1 * | 8/2017 | Kim | G06F 11/1072 |

FOREIGN PATENT DOCUMENTS

| | | |
|---|---|---|
| KR | 10201300997995 A | 9/2013 |
| KR | 101566467 B1 | 6/2014 |
| KR | 101417827 B1 | 7/2014 |
| KR | 10-1543369 B1 | 8/2015 |

* cited by examiner

METHOD AND APPARATUS FOR PERFORMING DATA RECOVERY IN A RAID STORAGE

CROSS-REFERENCE TO RELATED APPLICATIONS

This U.S. non-provisional patent application claims, under 35 USC § 119, priority to and the benefit of the filing date of Korean Patent Application No. 10-2016-0026263, filed on Mar. 4, 2016, the entirety of which is hereby incorporated by reference herein.

TECHNICAL FIELD

The present disclosure relates to a method and apparatus for performing data recovery in a Redundant Array of Independent Disks (RAID) storage device.

BACKGROUND

Flash memory devices are widely used as audio and image data storage media of information devices such as, for example, computers, smartphones, personal digital assistants (PDAs), digital cameras, camcorders, voice recorders, MP3 players, and handheld personal computers (PCs). However, an erase operation needs to be performed in advance to write data into flash memory, and a unit of written data is often greater than that of erased data. This prevents a file system for a typical hard disk from being used when flash memory is used as an auxiliary memory. In addition, this implies that sequential input/output processing to flash memory is more effective than non-sequential input/output processing.

A representative example of a high-capacity storage device based on flash memory is a solid state drive (hereinafter referred to as "SSD"). With increasing demand for SSDs, the manner and/or purpose for which SSDs are used have become varied. For example, SSDs may be implemented for use by a server, for use by a client, for use by a data center, and the like. An SSD interface should provide optimum speed and reliability according to the purpose for which the SSD is implemented. To meet this demand, Serial Advanced Technology Attachment (SATA), Peripheral Component Interconnect express (PCIe), and Serial Attached SCSI (SAS) interfaces, or the like, are typically used as optimal SSD interfaces.

A storage system including a plurality of storage devices is used for high reliability. For example, a RAID storage system partitions one data and distributes and stores partitioned "sub-stripes (data chunks)" in the storage devices. If one of the storage devices fails, the data that is stored in the failed storage device can be recovered using parity bits stored in the other storage devices that were generated from the data stored in the failed storage device. Because there is almost no case where all of the storage devices become problematic at the same time, the storage system guarantees high reliability of data.

Flash memory devices use error correction codes (ECCs) to correct read errors when data is read from flash memory. In some cases, a read error cannot be corrected by performing ECC recovery operations. It is known to use RAID storage techniques in flash memory devices to enable read errors to be corrected that were not able to be corrected by performing ECC recovery operations. Typically, an ECC recovery operation comprises many steps performed on a page where the read error occurred. If the read error was unable to be corrected by performing these steps, RAID recovery is performed, which involves reading pages belonging to the corresponding RAID stripe and using the read information, which includes parity, to correct the read error. Because RAID recovery is performed after ECC recovery has been unsuccessfully performed, performing RAID recovery necessarily increases maximum error correction times.

A need exists for a method and apparatus for performing RAID recovery that reduces the amount of time that is required to perform read error correction.

SUMMARY

The present disclosure relates to recovery method and apparatus that reduce the time required to recover an uncorrectable error when the uncorrectable error occurs in a RAID storage device.

In accordance with an exemplary embodiment the recovery method includes: reading a data chunk, in which an uncorrectable error occurs, from the plurality of nonvolatile memory devices, selecting a plurality of sub-stripes including a parity and excluding the data chunk, and performing, in parallel, a first recovery operation of adjusting a read level to recover the data chunk and a second recovery operation of processing the plurality of sub-stripes to recover a sub-stripe including the data chunk. The completion of one of the first and second recovery operation earlier in time that the other of the first and second recovery operations during the parallel performance constitutes completion of the recovery method.

In accordance with another exemplary embodiment, the recovery method includes: reading a data chunk, in which an uncorrectable error occurs, from the plurality of nonvolatile memory devices, predicting first and second amounts of time required to perform the first and second recovery operations, respectively to recover the data chunk in which the uncorrectable error occurs or predicting an effect on the nonvolatile memory devices that will result from performance of the first and second recovery operations, selecting one of the first and second recovery operations to be performed to recover the data chunk based on a result of the prediction, and performing the selected one of the first and second recovery operations to recover the data chunk. The first recovery operation uses the data chunk. The second recovery operation uses a plurality of sub-stripes in which the data chunk is not included and in which a parity is included.

In accordance with an exemplary embodiment, the apparatus for performing a data recovery operation in a RAID storage device that includes a plurality of nonvolatile memory devices comprising: logic configured to read a data chunk, in which an uncorrectable error occurs, from the plurality of nonvolatile memory devices, logic configured to select a plurality of sub-stripes including a parity and excluding the data chunk, and logic configured to perform, in parallel, a first recovery operation of adjusting a read level to recover the data chunk and a second recovery operation of processing the plurality of sub-stripes to recover a sub-stripe including the data chunk. Completion of one of the first and second recovery operations earlier in time than the other of the first and second recovery operations constitutes a completion of the data recovery operation in the RAID storage device.

These and other features and advantages will become apparent from the following description, drawings and claims.

BRIEF DESCRIPTION OF THE DRAWINGS

The forgoing and other features of inventive concepts will be described below in more detail with reference to the accompanying drawings of non-limiting example embodiments of inventive concepts in which like reference characters refer to like parts throughout the different views. The drawings are not necessarily to scale, emphasis instead being placed upon illustrating principles of inventive concepts. In the drawings.

DETAILED DESCRIPTION

Figure 1:
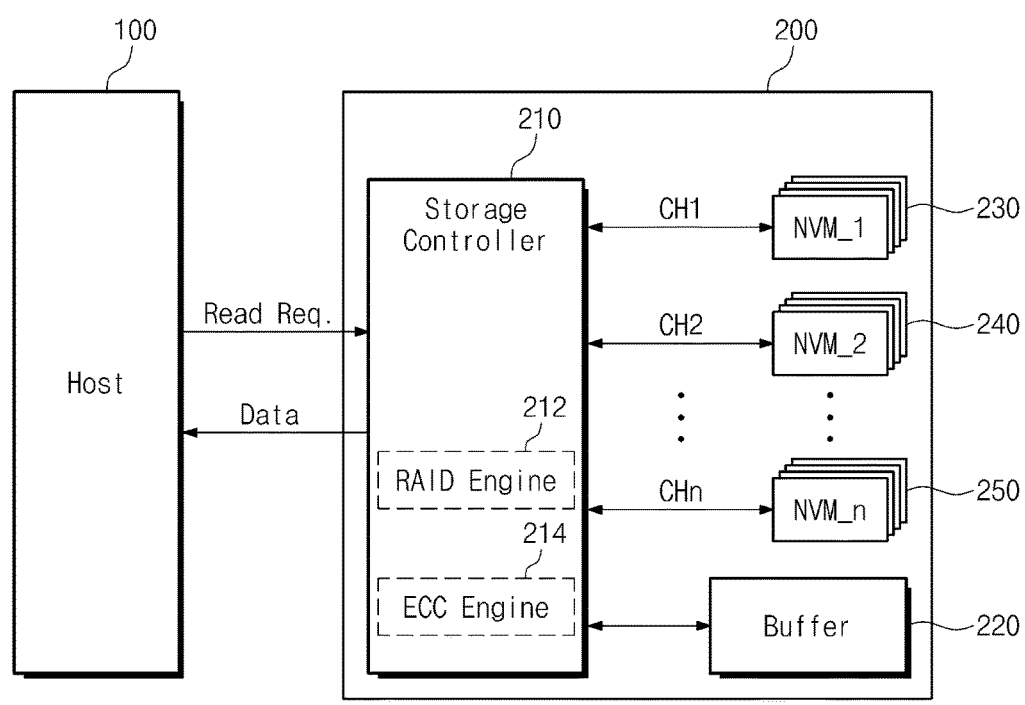
FIG. 1 is a block diagram of a user device in accordance with an exemplary embodiment.

In the following detailed description, for purposes of explanation and not limitation, example embodiments disclosing specific details are set forth in order to provide a thorough understanding of an embodiment according to the inventive principles and concepts. However, it will be apparent to one having ordinary skill in the art having the benefit of the present disclosure that other embodiments according to the present disclosure that depart from the specific details disclosed herein remain within the scope of the appended claims. Moreover, descriptions of well-known devices, elements or components may be omitted so as to not obscure the description of the example embodiments. Such devices, elements or components are clearly within the scope of the present disclosure. It should also be understood that the word "example," as used herein, is intended to be non-exclusionary and non-limiting in nature. More particularly, the word "exemplary" as used herein indicates one among several examples, and it should be understood that no undue emphasis or preference is being directed to the particular example being described.

It should be noted that when an element or component is referred to herein as being "connected to" or "coupled to" or "electrically coupled to" another element or component, it can be directly connected or coupled, or intervening elements may be present.

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this disclosure pertains. It will be further understood that terms, such as those defined in commonly used dictionaries, should be interpreted as having a meaning that is consistent with their meaning in the context of the relevant art unless expressly defined differently herein.

A few illustrative, or exemplary, embodiments will now be described with reference to the figures, in which like reference numerals represent like elements, components or features. The figures are not intended to be drawn to scale, emphasis instead being placed on describing inventive principles and concepts.

A solid state drive (SSD) using a flash memory device will be used herein as an example of the semiconductor NVM device that incorporates the method and apparatus for the purposes of describing inventive principles and concepts. However, those skilled in the art will understand that the inventive principles and concepts are not limited to this example. In addition, a flash recovery operation (hereinafter referred to as "an FR operation") and a RAID recovery operation (hereinafter referred to as "an RR operation") are described herein as respective techniques to recover uncorrectable errors (hereinafter referred to as "UCEs"). A UCE, as that term is used herein, means an error that exceeds the error correction ability of an ECC engine. An FR operation, as that term is used herein, means a combination of various flash recovery steps performed to eliminate a UCE. For example, the FR operation may include data recovery steps such as adjustment of a read level and valley search. The RR operation is a technique to recover data of a unit where a UCE occurs by using data where the UCE did not occur, in a RAID stripe. The inventive principles and concepts may be implemented in accordance with embodiments that are different from the exemplary embodiment described herein, as will be understood by those of skill in the art in view of the description being provided herein.

FIG. 1 is a block diagram of a user device 10 in accordance with an exemplary embodiment that includes a host 100 and a RAID storage device 200. The host 100 transmits a read request to the RAID storage device 200 to read data. The storage device 200 reads requested data from a plurality of nonvolatile memory devices 230, 240, and 250 and transmits the read data. The read request of the host 100 is provided as an example for purposes of demonstrating features according to inventive principles and concepts. However, the inventive principles and concepts are not limited to the performance of a read operation on the nonvolatile memory devices 230, 240, and 250 of the RAID storage device 200. For example, a read operation performed in the RAID storage device 200 may include garbage collection or metadata reading. Similar to the read request of the host 100, garbage collection for securing the number of free blocks or metadata reading at an open time may require high-speed responsibility. Hence, it should be understood that a recovery scheme according to inventive principles and concepts may be applied during a read operation performed on the nonvolatile memory devices 230, 240, and 250 in the RAID storage device 200 without an external command or external control (e.g., without a command issued by the host 100).

In particular, in accordance with an embodiment, when a UCE occurs, the RAID storage device 200 selects whichever of an FR operation or an RR operation is capable of being successfully performed in the shortest amount of recovery time. Alternatively, in accordance with another embodiment, when a UCE occurs, the RAID storage device 200 performs the FR operation and the RR operation in parallel. In the latter case, the overall data recovery is completed at a point in time when either the FR operation or the RR operation is the first to recover the data.

The host 100 writes data into the RAID storage device 200 or reads data stored in the RAID storage device 200. The host 100 may provide a command, an address, and data to the RAID storage device 200. The host 100 may request data using the command or the address from the storage device 200. For performing these tasks, the host 100 typically includes at least one processor that is programmed or otherwise configured to perform these and other tasks. The host 100 may be a processor itself or it may be an electronic device or system that includes one or more processors configured to perform these and other tasks.

The RAID storage device 200 accesses the nonvolatile memory devices 230, 240, and 250 and performs various operations required by the host 100 in response to a command, CMD, provided from the host 100. In particular, the RAID storage device 200 reads data stored in a buffer 220 or in the nonvolatile memory devices 230, 240, and 250 according to the command or the address provided from the host 100. The RAID storage device 200 transmits the read data to the host 100. In accordance with this exemplary embodiment, the RAID storage device 200 includes a storage controller 210, the buffer 220, and the nonvolatile memory devices 230, 240, and 250.

The storage controller 210 provides an interface between the host 100 and the RAID storage device 200. In accordance with an embodiment, the storage controller 210 performs FR and RR operations in parallel when a UCE occurs during a read operation. The recovery operation is completed by the storage controller 210 at a point in time when the UCE is recovered by the FR operation or by the RR operation, whichever recovers the data at the earliest point in time. The storage controller 210 transmits the recovered data to the host 100. In accordance with another embodiment, when a UCE occurs, the storage controller 210 predicts which of the FR and RR operations is capable of recovering the data earliest in time and then performs the recovery operation that is predicted to recover the data at the earliest point in time. In accordance with this embodiment, the storage controller 210 includes a RAID engine 212 and an ECC engine 214 for performing the RR and FR recovery operations, respectively.

The RAID engine 212 processes write-requested data in units of stripes for storing the write-requested data in the nonvolatile memory devices 230, 240, and 250 in accordance with a RAID scheme. For example, a single stripe may be divided into sub-stripes that are stored in the nonvolatile memory devices 230, 240, and 250, respectively. One of the sub-stripes may include one or more RAID parities generated using the other sub-stripes. When a UCE occurs at one or more sub-stripes included in a single stripe, the RAID engine 212 of the storage controller 210 is capable of performing an RR operation to recover the single stripe.

In addition, the ECC engine 214 of the storage controller 210 is capable of correcting a UCE by employing various recovery functions. For example, the ECC engine 214 of the storage controller 210 is capable of performing an FR recovery operation on a sub-stripe where a UCE occurs (chunk). For example, an FR operation can include various schemes such as, for example, read environment adjustment, valley search, and FR recovery operations can be applied to a chunk that occurs in one of the nonvolatile memory devices 230, 240, and 250.

As indicated above, in accordance with an embodiment the RAID storage device 200 performs an FR operation and an RR recovery operation in parallel when a UCE occurs in data read-requested from the host 100, in which case the data recovery is completed at a point in time when one of the recovery operations is the first to be successfully completed. Alternatively, in accordance with another embodiment, the RAID storage device 200 may select a recovery scheme with reference to wear-leveling information or read disturbance information of the nonvolatile memory devices 230, 240, and 250. That is, the RAID storage device 200 may calculate the amount of time required for the FR and RR operations to be performed and then execute whichever recovery operation can be performed in the shorter amount of time. In the latter case, the RAID storage device 200 may, for example, quantitatively calculate an effect on lifetime or performance depending on each of the FR and RR operations with reference to state information of the nonvolatile memory devices 230, 240, and 250. The RAID storage device 200 may then select the recovery scheme with great advantages based on the result of the calculation.

Figure 2:
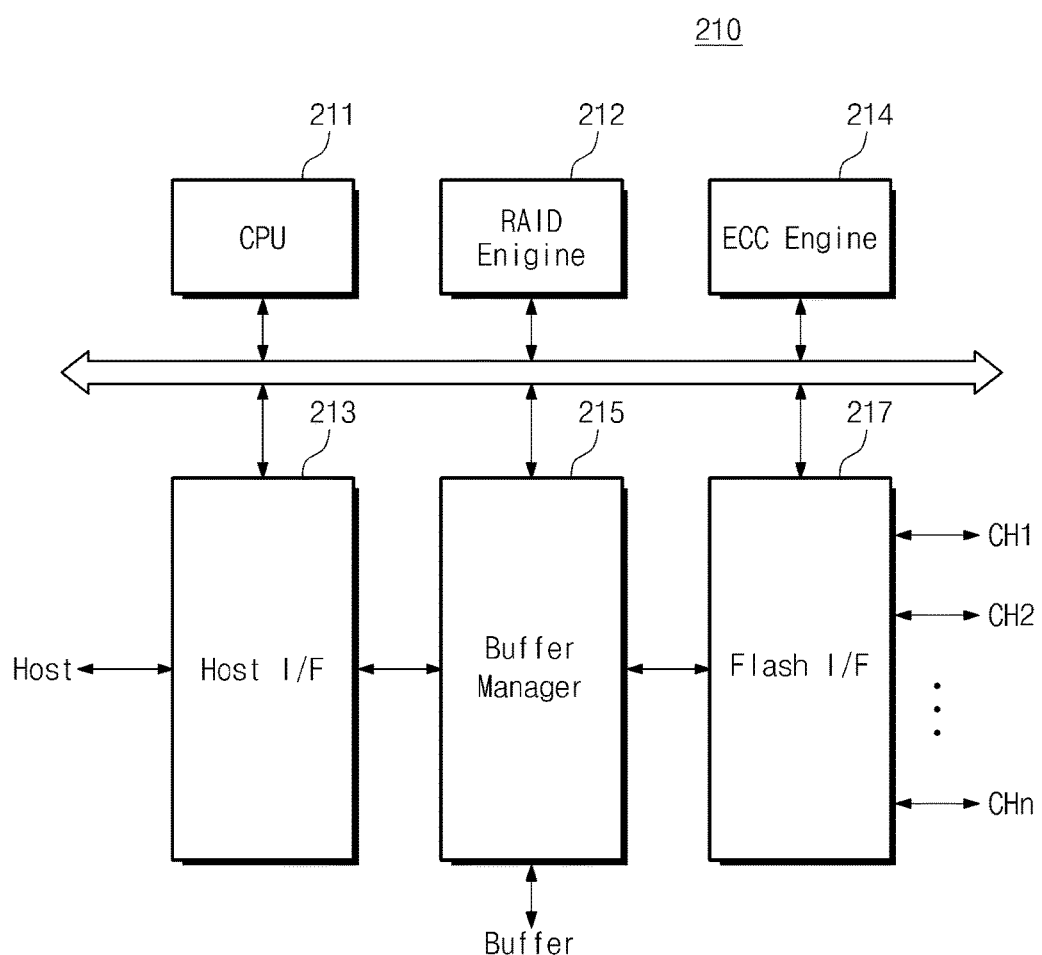
FIG. 2 is a block diagram illustrating the configuration of a storage controller shown in FIG. 1 in accordance with an exemplary embodiment.

FIG. 2 is a block diagram illustrating the configuration of the storage controller 210 in FIG. 1. As illustrated, the storage controller 210 includes a central processing unit (CPU) 211, the RAID engine 212, a host interface 213, the ECC engine 214, a buffer manager 215, and a flash interface 217.

The CPU 211 transmits various control information required for read/write operations on the nonvolatile memory devices 230, 240, and 250 (see FIG. 1) to the host interface 213 and to the flash interface 217. For example, the CPU 211 typically executes a flash translation layer (FTL) to perform garbage collection for managing the nonvolatile memory devices 230, 240, and 250, address mapping, wear-leveling or the like.

The CPU 211 performs recovery operations according to the exemplary embodiments to perform data recovery. The CPU 211 performs FR and/or RR recovery operations, when a UCE is detected in read-requested data. As indicated above, FR and RR recovery operations may be performed in parallel, i.e., simultaneously, or one of an FR and an RR recovery operation is performed based on whichever of the operations is predicted to be completed at the earliest point in time. Hereinafter, performing the FR and RR recovery operations in parallel will be referred to as a parallel recovery operation. Hereinafter, performing whichever of the FR and the RR operations is predicted to be capable of being completed at the earliest point in time will be referred to herein as a predictive recovery operation.

During the parallel recovery operation, the CPU 211 completes the overall recovery operation when either the FR operation or the RR operation completes before the other operation completes. During the selected recovery operation, the CPU 211 may predict the amount of time required to perform the FR and RR operations or it may predict loss caused by performing the recovery operations and select either the FR operation or the RR operation based on the prediction.

For the parallel recovery operation or the predictive recovery operation, a corresponding recovery algorithm is executed in the CPU 211. The computer code, or instructions, comprising the algorithm for the parallel recovery or the predictive recovery may be stored in a non-transitory computer-readable medium (CRM) such as, for example, a read only memory (ROM) device (not shown) or the nonvolatile memory devices 230, 240, and 250 of the RAID storage device 200. During booting, the computer code or instructions comprising the algorithm may be loaded into the internal buffer 220 and executed by the CPU 211.

The RAID engine 212 divides data provided from the host 100 in units of stripes and stores the stripes in the nonvolatile memory devices 230, 240, and 250 after distributing each stripe in units of sub-stripes, respectively. The RAID engine 212 generates a parity to generate data in units of stripes. It is to be understood that the number and the manner in which the sub-stripes corresponding to the parity are configured may vary depending on RAID type, or level. Each sub-stripe typically includes at least one ECC-decodable sub-stripe.

RAID, which will be described later, may be implemented in various levels. For example, the RAID may be RAID level 0 (striped set without parity or Striping), RAID level 1 (mirrored set without parity or mirroring), RAID level 2 (Hamming code parity), RAID level 3 (striped set with dedicated parity, bit interleaved parity, or byte level parity), RAID level 4 (block level parity), RAID level 5 (striped set with distributed parity or interleave parity), RAID level 6 (striped set with dual distributed parity), RAID level 7, RAID level 10, and a merged RAID level achieved by merging any one of 53 RAID levels or at least two of the above RAID levels (e.g., RAID 0+1, RAID 1+0, RAID 5+0, RAID 5+1 or RAID 0+1+5).

The host interface 213 communicates with the host 100. For example, the host interface 213 provides a channel for communication with the host 100. The host interface 213 provides a physical connection between the host 100 and the RAID storage device 200. That is, the host interface 213 provides interfacing with the RAID storage device 200, which corresponds to a bus format of the host 100. The bus format of the 100 may include at least one of Universal Serial Bus (USB), Small Computer System Interface (SCSI), Peripheral Component Interconnect (PCI) express, AT Attachment (ATA), Parallel ATA (PATA), Serial ATA (SATA), Serial Attached SCSI (SAS), and Universal Flash Storage (UFS).

The ECC engine 214 performs encoding for error correction and detection on write-requested data. The ECC engine 214 is capable of detecting and correcting an error included in data read from the nonvolatile memory devices 230, 240, and 250. The ECC engine 214 has a limitation in correctable bit number. When an error of bit number exceeding the limitation is detected, the ECC engine 214 determines that the detected error is a UCE. The ECC engine 214 notifies the CPU 211 that when a UCE occurs. Then, either the parallel recovery operation or the predictive recovery operation is enabled by the CPU 211.

The buffer manager 215 controls read and write operations of the internal buffer 220 (see FIG. 1). For example, the buffer manager 215 temporarily stores write data or read data in the internal buffer 220.

The flash interface 217 exchanges data with the nonvolatile memory devices 230, 240, and 250. The flash interface 217 writes data transmitted from the internal buffer 220 into the nonvolatile memory devices 230, 240, and 250 by way of the memory channels CH1, CH2, . . . , and CHn. Read data from the nonvolatile memory devices 230, 240, and 250, which are provided via memory channels, are collected by the flash interface 217. The collected data may be stored in the internal buffer 220.

Through the above-described structure, the storage controller 210 stores data in the nonvolatile memory devices 230, 240, and 250 in accordance with a RAID scheme. When a UCE is detected in data read from the nonvolatile memory devices 230, 240, and 250, the storage controller 210 performs either a parallel recovery operation or a predictive recovery operation. With application of the recovery scheme, the storage controller 210 recovers the data at high speed when a UCE occurs.

Figure 3:
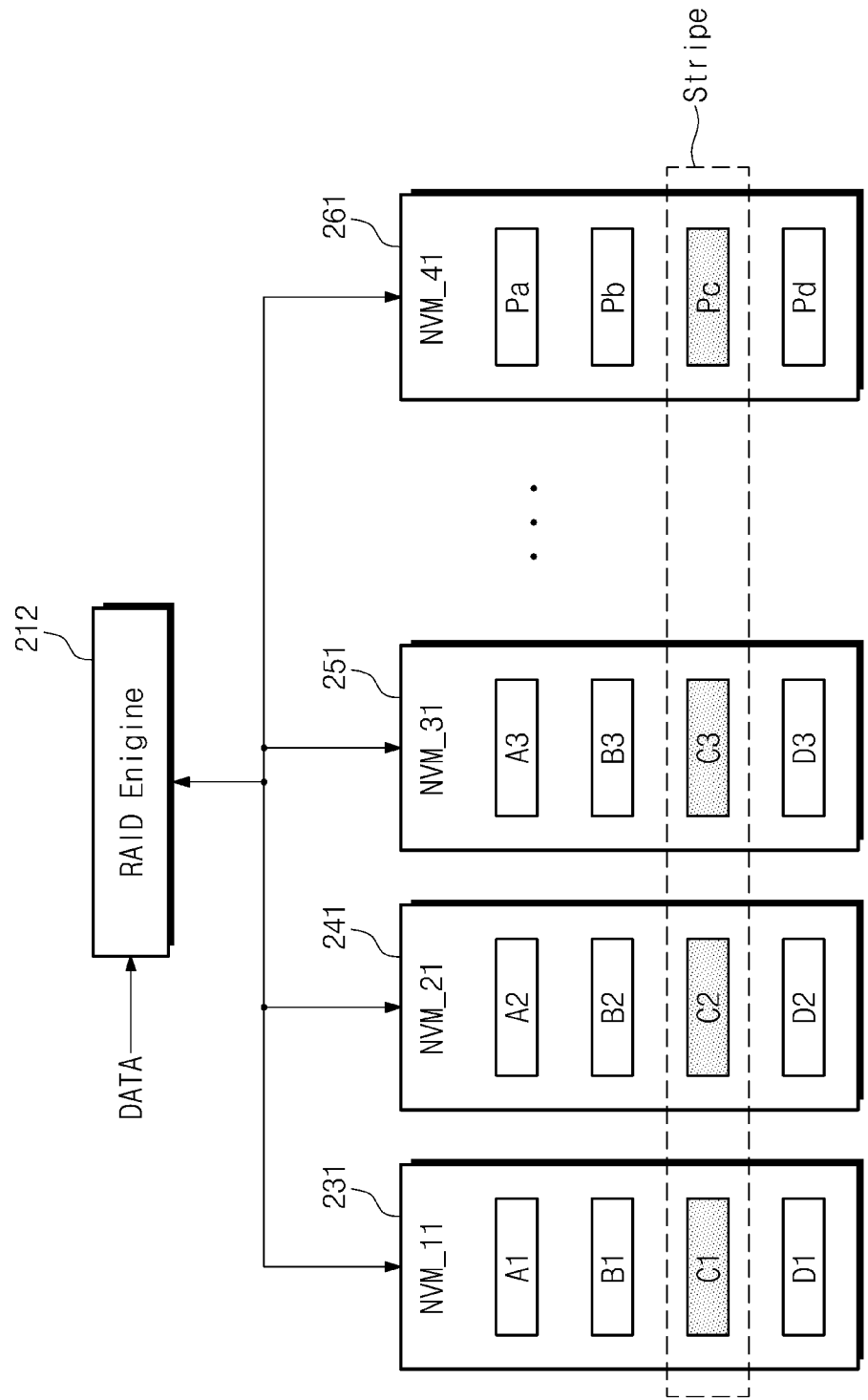
FIG. 3 is a block diagram illustrating operation of a RAID engine in accordance with an exemplary embodiment.

FIG. 3 is a block diagram illustrating operation of the RAID engine 212 according to an exemplary embodiment. Referring to FIG. 3, the RAID engine 212 divides data DATA required from the host 100 into sub-stripes. The RAID engine 212 distributes and stores the divided sub-stripes in a plurality of storages. One or more parity sub-stripes are included in the divided sub-stripes. The storage may correspond to, for example, a semiconductor chip or a die. Since there is little probability that an error occurs in a plurality of storages at the same time, the reliability of the stored data is improved by the RAID engine 212.

In accordance with this embodiment, data, DATA, is transmitted between the host 100 and the RAID storage device 200 in units of stripes. A user of the host 100 or of the RAID storage device 200 selects a data size of a stripe. The data DATA may include one or more stripes. A single stripe may include a plurality of sub-stripes. The stripe may include a parity referenced to check an error of the sub-stripes. The sub-stripes and the parity may be distributed and stored in a plurality of nonvolatile memory devices 231, 241, 251, and 261.

For better understanding, it will be assumed that i stripes are provided to the RAID storage device 200 from the host 100 and each of the i stripes includes (n−1) sub-stripes and a single parity. Under this assumption, sub-stripes and a single parity included in each stripe are distributed and stored in n nonvolatile memory devices 231, 241, 251, and 261.

A single sub-stripe may have a data size corresponding to a read unit of a read operation performed in the nonvolatile memory devices 231, 241, 251, and 261. Data stored in the nonvolatile memory devices 231, 241, 251, and 261 may be read in a read unit having the same size as the sub-stripe.

If an error occurs in a single sub-stripe stored in a single storage, employment of the above-described RAID configuration allows the sub-stripe to be recovered with reference to a parity. For example, when an error occurs at a stripe that includes sub-stripes C1, C2, C3, . . . and a parity Pc, the storage controller 210 can recover an error-occurring sub-stripe by using the parity Pc and the sub-stripes where the error did not occur. Thus, the RAID storage device 200 can guarantee high reliability of data.

In some embodiments, each of the nonvolatile memory devices 231, 241, 251, and 261 may be implemented with a single semiconductor chip or die. Each of the chips or dies may be connected to independently accessible channels by the storage controller 210.

Figure 4:
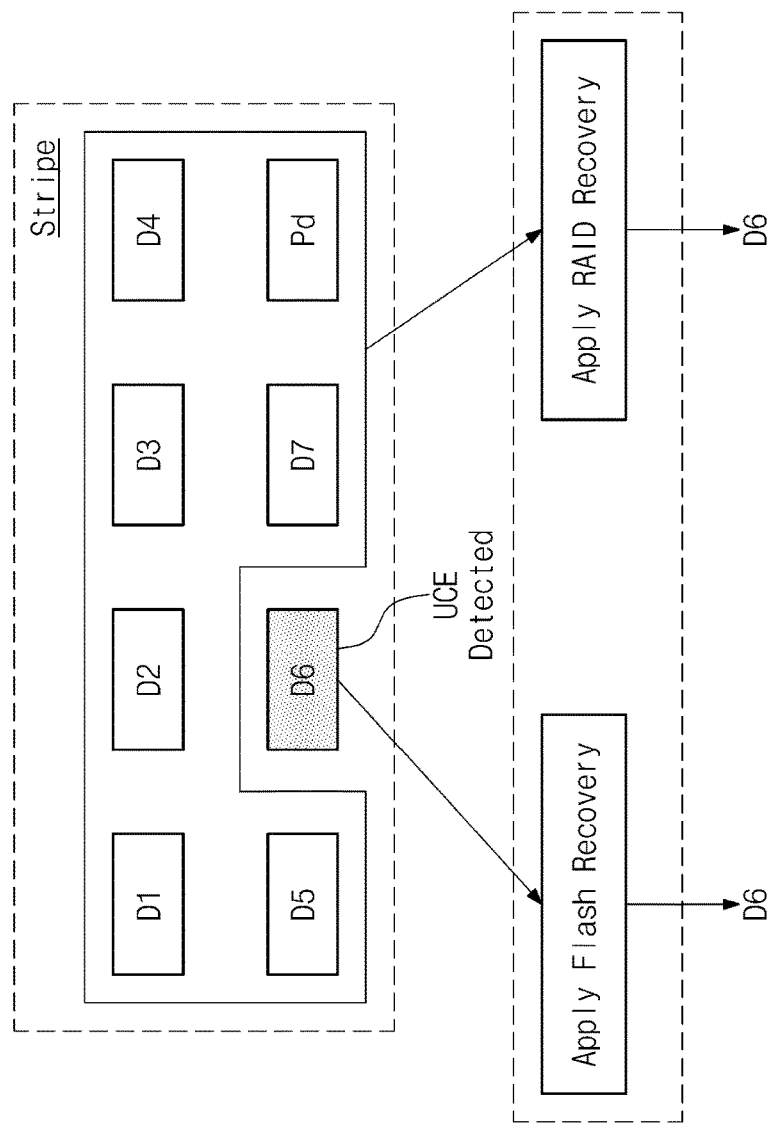
FIG. 4 is a block diagram illustrating a data unit that is the target of flash recovery and RAID recovery operations in accordance with an exemplary embodiment.

FIG. 4 is a block diagram illustrating a data unit that is the target of a parallel recovery operation in accordance with an exemplary embodiment. Referring to FIG. 4, in accordance with this example, a single stripe includes seven sub-stripes D1, D2, D3, D4, D5, D6, and D7 and one parity Pd. Each of the sub-stripes D1, D2, D3, D4, D5, D6, and D7 and the parity Pd may be data divided into units of chips or dies. In addition, it will be assumed that there is a UCE in the sub-stripe D6.

When a read request of data corresponding to the sub-stripe D6 is issued by the host 100, the storage controller 210 accesses a chip or a die in which the sub-stripe D6 is stored. The storage controller 210 performs an error detection operation on the sub-stripe D6. When no error exists or a correctable error is detected, the storage controller 210 transmits a data set corresponding to the sub-stripe D6 to the host 100.

On the other hand, when a UCE is detected in the sub-stripe D6, the storage controller 210 performs a parallel recovery operation, i.e., an FR operation and an RR in parallel. The storage controller 210 completes the overall recovery operation at an end point in tome corresponding to the point in time when either the FR operation or the RR operation is the first to recover the data.

Alternatively, the storage controller 210 can predict the amounts of time required for the FR and the RR operations to recover the UCE, and based on the result of the prediction, perform whichever one of the recovery operations is predicted to recover the UCE in the shortest amount of time. The prediction of the amounts of time required to perform the FR and the RR operations will be described below in further detail.

During an FR operation to recover the UCE, the storage controller 210 may repeatedly access a chip or a die in which the sub-stripe D6 is stored. Meanwhile, during an RR operation to recover the UCE, the storage controller 210 may access a chip or a die in which the sub-stripes D1, D2, D3, D4, D5, and D7, but not the sub-stripe D6, are stored and the chip or die in which the parity Pd is stored. It should be noted that although only one exemplary parity Pd is shown, parities may be stored in two or more chips or dies depending on the RAID level that is being implemented.

Figure 5:
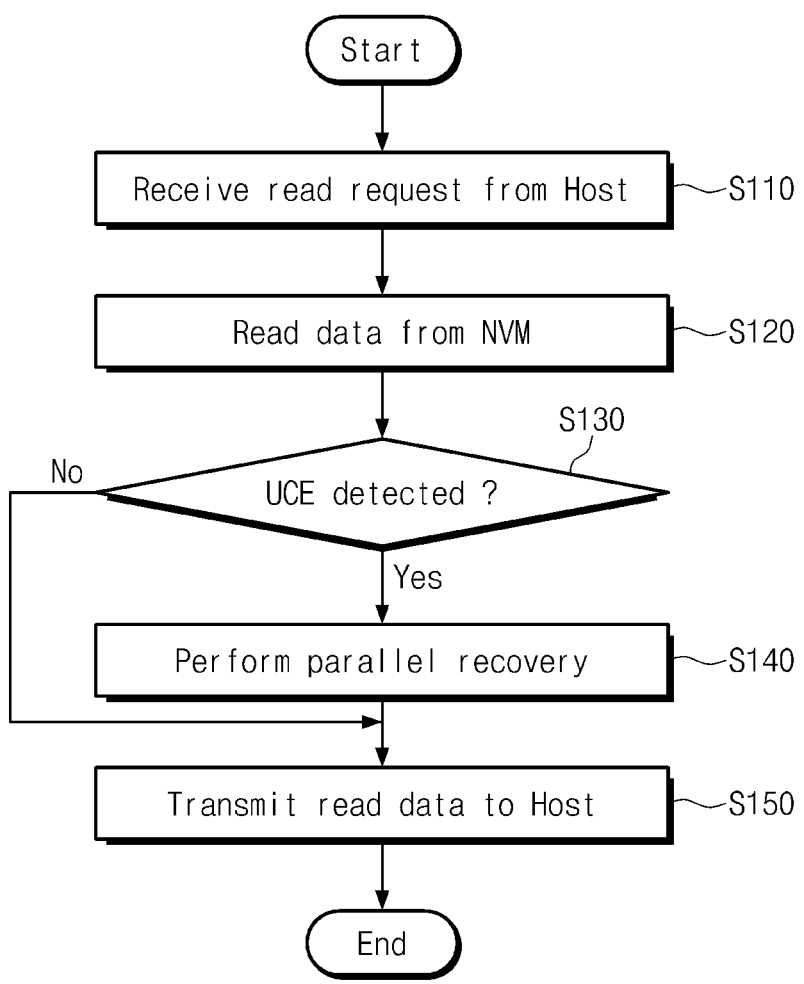
FIG. 5 is a flowchart summarizing a parallel recovery operation in accordance with an exemplary embodiment.

FIG. 5 is a flowchart summarizing a parallel recovery operation according to an exemplary embodiment. In S110, the RAID storage device 200 (see FIG. 1) receives a read request from the host 100. In S120, the storage controller 210 accesses a storage area of an address provided during the read request. For example, the storage controller 210 may access one of the nonvolatile memory devices 230, 240, and 250 to read data. In S130, the storage controller 210 detects an error of the read data using the ECC engine 214. When no error exists in the read data or a correctable error is detected in the read data (No Direction), the flow proceeds to S150. When the correctable error is detected, the flow proceeds to S150 after an error correction operation is performed by the ECC engine 214. Meanwhile, when a UCE is detected (Yes direction), the flow proceeds to S140.

In S140, the storage controller 210 performs an FR operation and an RR operation in parallel such that the overall recovery operation is completed by the storage controller 210 when either the FR or the RR operation is the first to recover the UCE. The detailed operation of S140 will be described below in more detail with reference to FIGS. 6 and 7. In S150, the storage controller 210 transmits the recovered data to the host 100.

So far, the parallel recovery operation has described generally with reference to an exemplary embodiment. The parallel recovery operation will now be described in more detail. During the parallel recovery operation, sufficient resources to perform the FR and the RR operations should be secured, or allocated. For example, a multi-core central processing unit (CPU) and a working memory of sufficient capacity should be secured.

Figure 6:
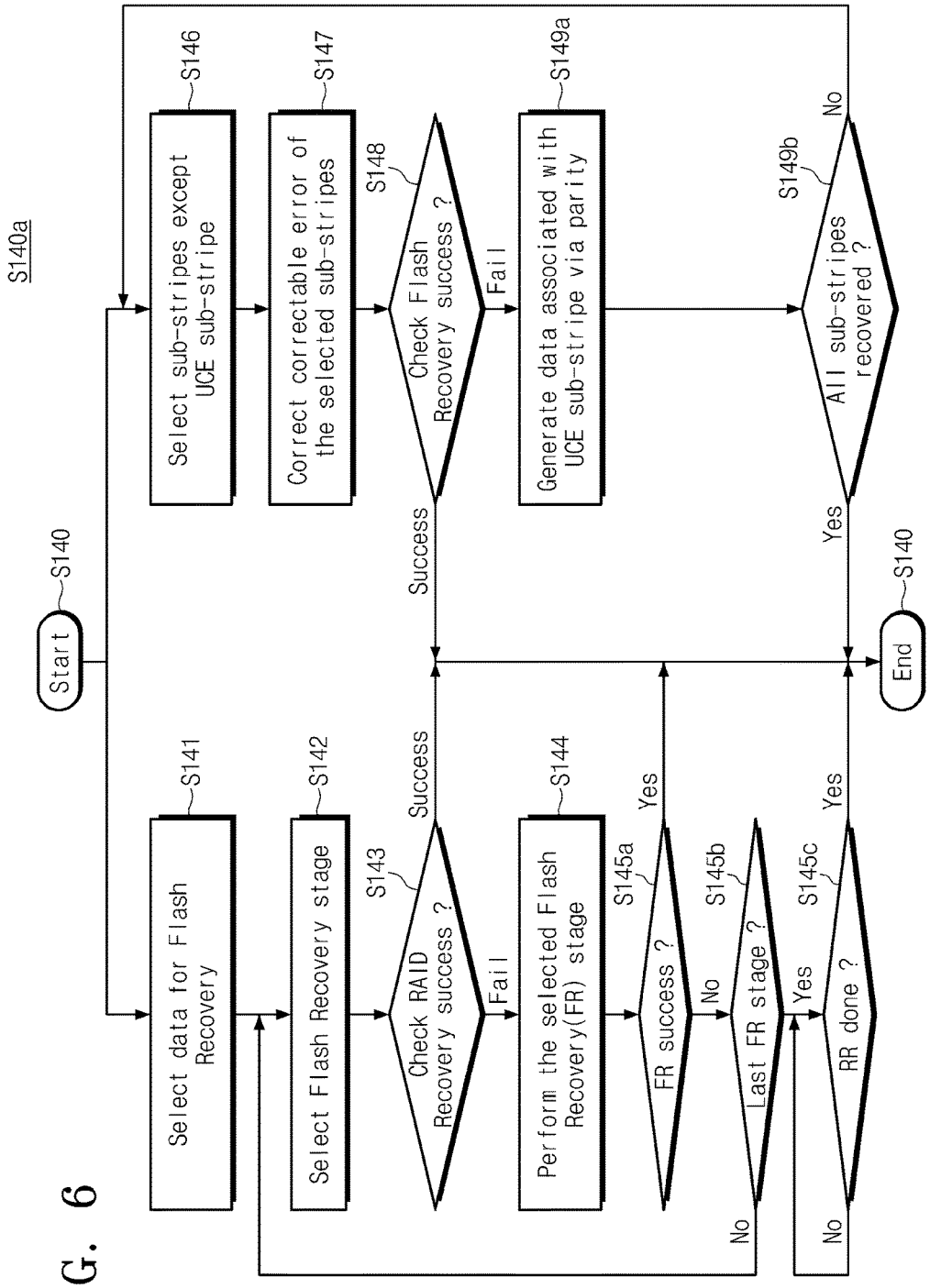
FIG. 6 is a detailed flowchart illustrating an exemplary embodiment of S140 shown in FIG. 5.

FIG. 6 is a detailed flowchart illustrating an exemplary embodiment of step S140 in FIG. 5, which is referred to in FIG. 6 as S140a. In S140a, S141 to S145b, which are steps for performing an FR operation, and S146 to S149b, which are steps for performing an RR operation, are enabled together when a UCE is detected. That is, S141 for selecting data to perform the FR operation and S146 for selecting data to perform the RR operation are enabled at the same time or with a predetermined time difference.

In S141, the storage controller 210 selects data to perform the FR operation. For example, the storage controller 210 may read data of a chip or a die in which UCE-detected data is stored.

In S142, the storage controller 210 selects one of a plurality of flash recovery stages included in the FR operation. For example, the FR operation may include a flash recovery stage in which a selected area of memory is re-read in a manner of adjusting a level of a read bias or a read voltage. Additionally, the plurality of flash recovery stages may include stages in which an algorithm such as valley search and regression analysis for detecting an optimal read level is executed. When one of the plurality of flash recovery stages is selected, the flow proceeds to S143.

In S143, in accordance with this exemplary embodiment, the storage controller 210 checks whether the RR operation is completed. Thus, before the selected flash recovery stage starts, the storage controller 210 detects whether the RR operation is completed and the flash recovery stage may or may not be performed depending on the result of the detection. For example, the storage controller 210 may include a register to mark whether the FR operation and the RR operation are completed, respectively. A check of the register may be made to determine whether the RR operation is completed by monitoring a bit value of the register. If the RR check of the register indicates that the RR operation has been completed (Success), the overall recovery operation is complete and the process of S140 ends ("End"). On the other hand, if the check of the register indicates that the RR operation has not been completed, i.e., it is currently being performed (Failure), the flow proceeds to S144.

In S144, the storage controller 210 executes the selected one of the plurality of recovery stages for the FR operation.

For example, when a stage is selected to adjust a read level, the storage controller 210 may read data by repeatedly accessing the chip or the die where the UCE occurs. An optimal read level is decided with reference to the result, and the UCE-occurring data is re-read using the decided optimal read level. In this manner, the FR operation may be performed.

In S145*a*, the storage controller 210 eliminates a UCE through execution of the selected stage and determines whether the FR operation is successful. For example, when a UCE is not detected in the data read using the optimal read level, the FR operation is determined to be successful. If the FR operation is determined to be successful (Yes direction), the overall parallel recovery operation may be completed ("End" S140). If the FR operation is determined to have failed (No direction), the flow proceeds to S145*b*.

In S145*b*, the storage controller 210 determines whether the recovery stage selected in S142 is the last stage of the FR operation. If the recovery stage selected in S142 is not the last stage of the FR operation (No direction), the flow proceeds to S142 to select a new stage. Meanwhile, if the executed stage of the FR operation is the last stage (Yes direction), the flow proceeds to S145*c*.

In S145*c*, the storage controller 210 determines whether the overall RR operation is completed. For example, when the UCE is not recovered by the FR operation, an execution state of the RR is detected. In this case, the UCE is recovered by the RR operation or the UCE is not recovered at all. In accordance with this embodiment, when the RR operation is still being performed (No direction at S145*c*), the flow remains at S145*c* until the RR operation is completed. However, if the UCE is recovered by the RR operation or the RR operation is completed without recovering the UCE (Yes direction at S145*c*), the overall parallel recovery operation is complete ("End" S140).

In S146, the storage controller 210 selects sub-stripes to which the RR operation is to be applied. For example, the storage controller 210 may read sub-stripes of chips or dies other than a chip or a die where the UCE is detected.

In S147, the storage controller 210 detects and corrects an error of the read sub-stripe using the ECC engine 214. A case where a UCE occurs in the read sub-stripe will be described in example embodiments of FIG. 7. However, when a correctable error exists, the RR operation may be performed using an error-corrected sub-stripe.

In S148, the storage controller 210 detects whether the UCE has been recovered by the FR operation being performed in parallel. In other words, before the RR operation starts to be performed on the selected sub-stripes, the storage controller 210 detects whether the FR operation being performed in parallel has been completed. According to a result of the detection, an RR operation may or may not be performed on the selected sub-stripes. For example, the storage controller 210 may refer to a register to determine whether the FR operation has been completed with success. If a check of the register reveals that the FR operation has been successfully completed, the overall recovery operation is complete and the flow proceeds to "End" S140. Meanwhile, if the check of the register reveals that the FR operation has not been completed with success (Failure), the flow proceeds to S149*a*.

In S149*a*, the storage controller 210 performs an RR operation. Although the RR operation that is performed will depend on the RAID level being implemented, data of an UCE-occurring sub-stripe may be generated using a parity.

In S149*b*, the storage controller 210 determines whether the RR operation on all the sub-stripes has been completed. If the RR operation is required for additional sub-stripes, the flow returns to S146. However, if sub-stripes requiring recovery have all been recovered, the overall parallel recovery is complete and the flow proceeds to "End" S140.

Figure 7:
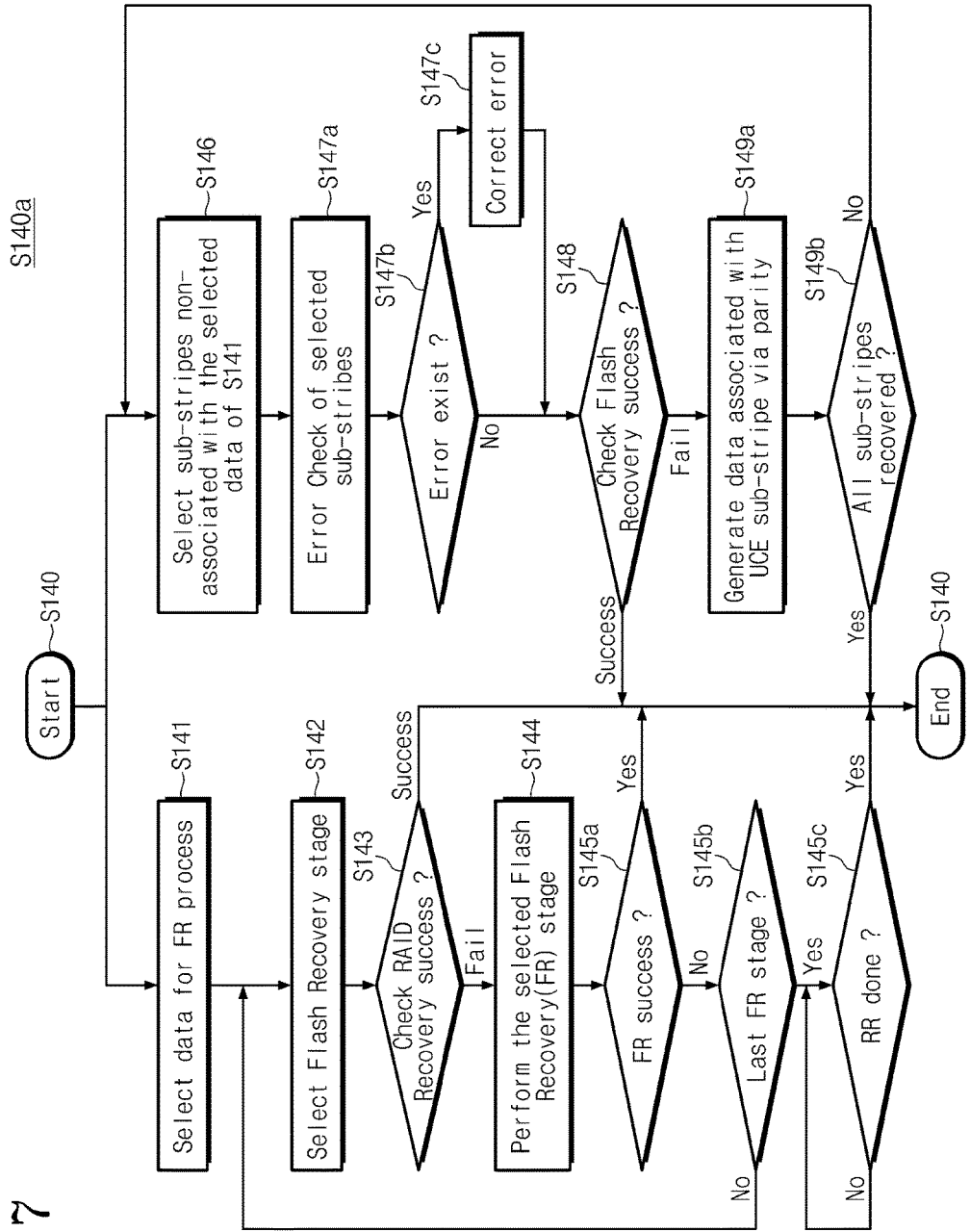
FIG. 7 is a flowchart illustrating a parallel recovery operation in accordance with an exemplary embodiment.

The description of FIG. 6 assumes that no UCE exists in a sub-stripe. With reference to FIG. 7, a description will be provided of a parallel recovery operation in the case where a UCE occurs in a sub-stripe on which an RR operation is performed.

FIG. 7 is a flowchart illustrating a parallel recovery operation according to an exemplary embodiment. Referring to FIG. 7, S141, S142, S143, S144, S145*a*, S145*b*, and S145*c* describing an FR operation are substantially identical to those in FIG. 6. Therefore, their descriptions will be omitted herein.

In S146, the storage controller 210 selects sub-stripes to which an RR operation is to be applied. For example, the storage controller 210 may select sub-stripes in which a data chunk selected in S141 is not included.

In S147*a*, the storage controller 210 checks to determine whether an error exists in a read sub-stripe using the ECC engine 214.

In S147*b*, if no error exists in read sub-stripes (No direction), the flow proceeds to S148 where a check of the aforementioned register is performed to determine whether an FR operation has been successfully completed. Meanwhile, when an error exists in the read sub-stripes (Yes direction at S147*b*), the flow proceeds to S147*c* to process the detected error.

In S147*c*, the detected error is corrected. When the number of detected errors is within the error correction ability of the ECC engine 214, the storage controller 210 corrects the detected error using the ECC engine 214. However, when the number of the detected errors is beyond the error correction ability of the ECC engine 214, the storage controller 210 applies the FR operation to process the detected error. For example, the storage controller 210 may recover a UCE by adjusting a read level or various driving environments for a sub-stripe in which the UCE exists.

In S148, the storage controller 210 detects whether the UCE is recovered by the FR operation being performed in parallel. Before the RR operation is started for the selected sub-stripes, the storage controller 210 detects whether the FR performed in parallel successfully completed. Depending on a result of the detection, an RR operation may be performed on the selected sub-stripes. For example, the storage controller 210 may refer to the aforementioned register to check whether the FR has successfully completed. If the check of the register reveals that the FR operation successfully completed (Success), the overall recovery operation is complete ("End" S140). If the check of the register reveals that the FR operation has not successfully completed, the flow proceeds to S149*a*.

In S149*a*, the storage controller 210 performs an RR operation. Although the manner in which the RR is performed varies depending on the RAID level being implemented, data of a UCE-occurring sub-stripe may be generated using a parity.

In S149*b*, the storage controller 210 determines whether the RR on all the sub-stripes has been completed. If the RR is required to be performed for additional sub-stripes, the flow returns to S146. However, is all sub-stripes requiring recovery have been recovered, the overall parallel recovery process is complete ("End" S140).

With reference to FIG. 7, the description has been made as to a parallel recovery operation when an error exists in a sub-stripe for applying an RR operation.

Figure 8:
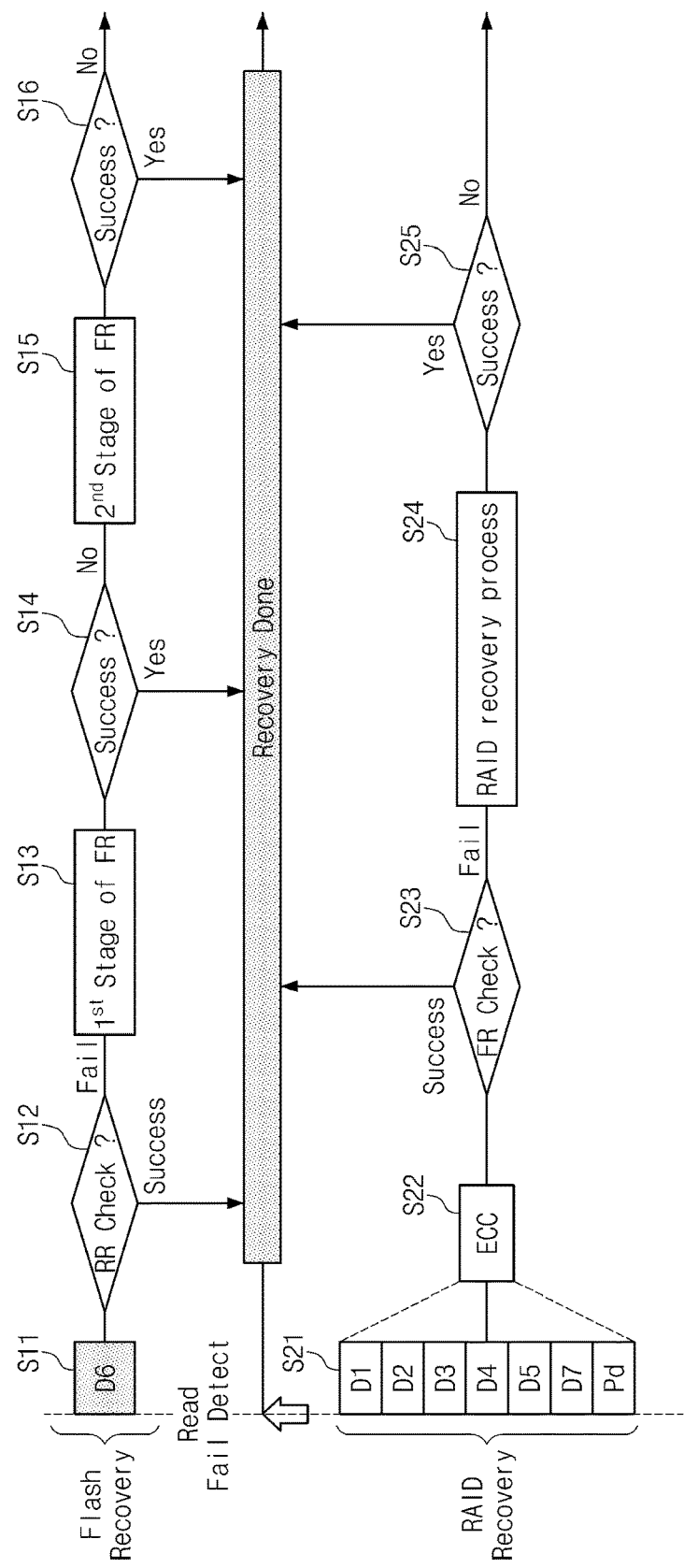
FIG. 8 expresses, along a time axis, a parallel recovery operation in accordance with an exemplary embodiment.

FIG. 8 expresses, along a time axis, a parallel recovery operation according to an exemplary embodiment. Referring to FIG. 8, when a read failure or a UCE is detected, a parallel recovery operation starts. S12, S13, S14, S15, and S16 are performed for FR, and S21, S22, S23, S24, and S25 are performed for RR.

When a UCE is detected, data selection for the FR operation or the RR operation is done in S11 and S21, respectively. In S11, an UCE-detected data chunk D6 is selected for the FR operation. In S21, UCE-undetected sub-stripes (e.g., D1, D2, D3, D4, D5, and D7) and a parity Pd are selected. It is to be understood that some of the sub-stripes (e.g., D1, D2, D3, D4, D5, and D7) and the parity Pd may be sequentially selected.

In S12, a check may be made as to whether the RR operation has been successfully completed. If the RR operation is determined to have been successfully completed (Success), the overall recovery operation is complete ("Recovery Done"). However, if the RR is determined to have failed (Failure) or is determined to be in the process of being performed, the flow proceeds to S13 to perform a first stage of the FR operation.

In S13, the first stage of the FR operation is performed. In S14, a check is made as to whether the first stage of the FR was successfully performed. If a UCE is determined to be recovered by the first stage of the FR operation, the overall recovery operation is complete ("Recovery Done"). However, if the first stage of the FR operation is determined to have failed, the flow proceeds to S15 to perform a second stage of the FR operation. It should be understood that at each point in time, a determination may be made as to whether the FR operation has been successfully performed. In S16, a check is made as to whether the second stage of the FR operation has been successfully performed. If the UCE is determined to be recovered by the second stage of the FR operation, the overall recovery operation is complete ("Recovery Done").

In S22, error correction of sub-stripes is done for the RR operation. It is to be understood that the error correction includes a recovery operation performed on a UCE.

In S23, a check is made as to whether the FR operation being performed in parallel has been successful. If the UCE is determined to have been recovered by any one stage of the FR operation, the overall recovery operation is complete. However, if any one stage of the FR operation is determined to be in the process of being performed or is determined to have failed, the flow proceeds to S24. Even before S22 is performed, S23 may be performed. Even if the FR operation is completed while data is read for the RR operation, the RR operation should be stopped. A reading step of S22 and an operation step of S24 may be performed in parallel. It is to be understood that, as a result, a check as to whether the FR operation is successful may be made between any and all operations, and S22 and S24 may be performed at the same time.

In S24, an operation that is part of the RR operation is performed. For example, UCE-occurring sub-stripes may be recovered by applying a parity to the selected sub-stripes. In S25, a determination is made as to whether the RR operation was successful. If the UCE is recovered by the RR operation, the overall parallel operation is complete ("Recovery Done").

So far, the parallel recovery operation according to example embodiments of inventive concepts has been described on the basis of a time axis. However, it is to be understood that the parallel recovery may be modified in various manners.

Figure 9:
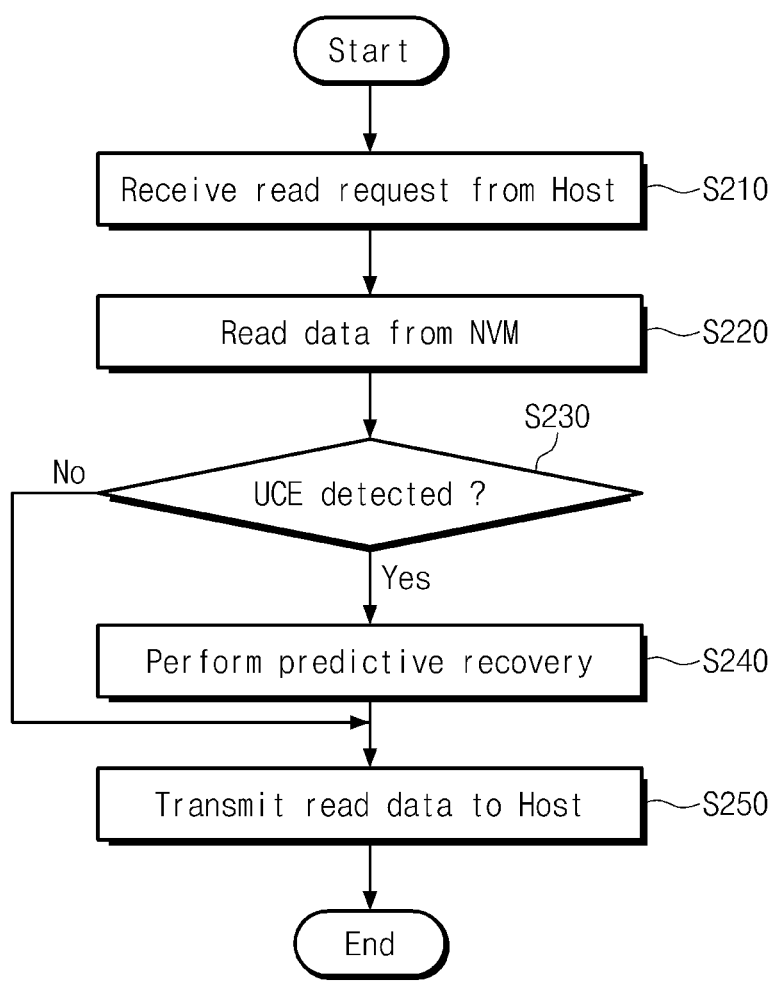
FIG. 9 is a flowchart illustrating a predictive recovery operation in accordance with an exemplary embodiment.

FIG. 9 is a flowchart illustrating a predictive recovery operation according to an exemplary embodiment. Referring to FIG. 9, rather than performing a parallel recovery process, a predictive recovery operation may be performed during which one of an FR operation and an RR operation is selectively performed to recover a UCE. The FR operation or the RR operation is selectively performed based on a prediction as to which operation can be successfully performed in a shorter amount of UCE recovery time.

In S210, the RAID storage device 200 (see FIG. 1) receives a read request from the host 100.

In S220, the storage controller 210 accesses a storage area of an address provided during the read request. For example, the storage controller 210 may access one of the nonvolatile memory devices 230, 240, and 250 to read data.

In S230, the storage controller 210 detects an error of read data using the ECC engine 214. If no error exists in the read data or a correctable error is detected in the read data (No direction), the flow proceeds to S250. If a correctable error is detected in S230, the flow proceeds to S250 after an error correction operation is performed by the ECC engine 214. If a UCE is detected in the read data (Yes direction), the flow proceeds to S240.

In S240, the storage controller 210 performs a predictive recovery operation. The predictive recovery operation will be described in detail below with reference to FIGS. 10 and 11. For predictive recovery, the storage controller 210 predicts an amount of time that will be required to recover the UCE by each of a FR operation and an RR operation and selects the operation that is predicted to perform recovery in the shorter amount of time. Only one selected recovery scheme will be used in the predictive recovery operation. Thus, the overall recovery operation will be completed as of the point in time when the selected recovery operation is completed.

In S250, the storage controller 210 transmits the recovered data to the host 100.

So far, the predictive recovery operation according to an exemplary embodiment has been described in brief. When the predictive recovery operation is used, a UCE may be processed using a relatively small amount of resources.

Figure 10:
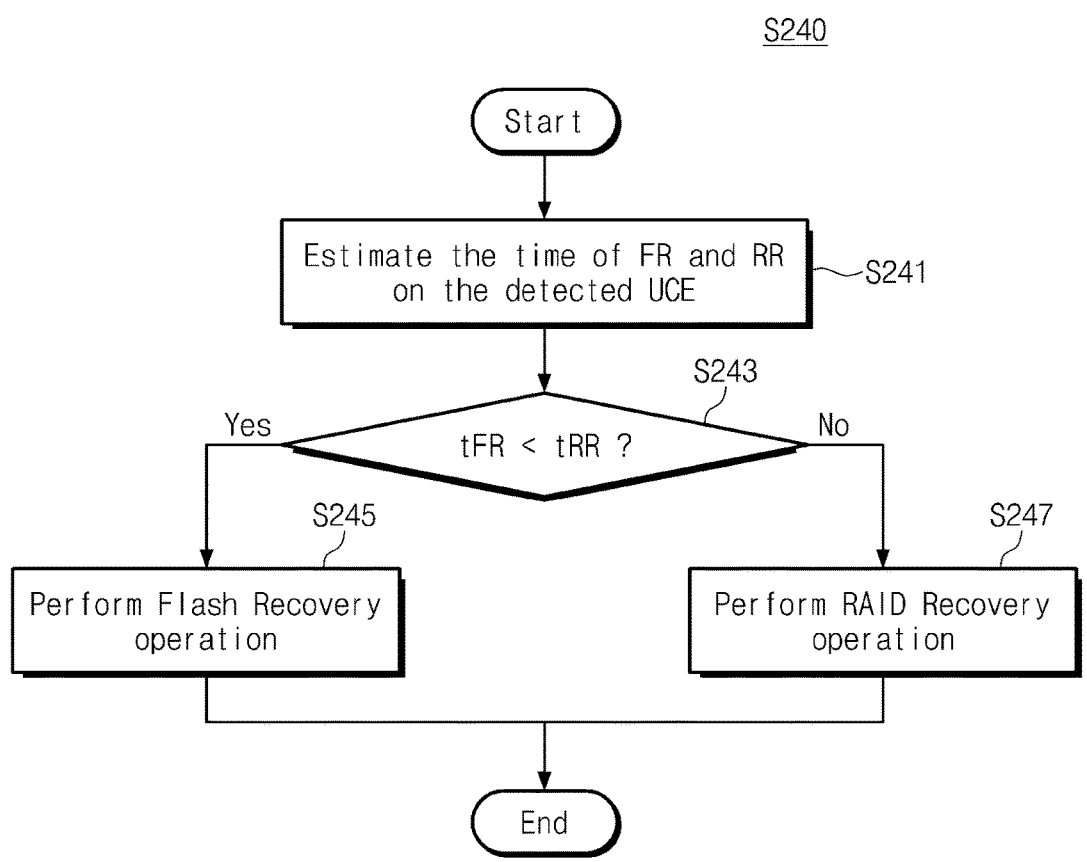
FIG. 10 is a flowchart illustrating an exemplary embodiment of S240 shown in FIG. 9.

FIG. 10 is a flowchart illustrating an exemplary embodiment of S240 in FIG. 9. Referring to FIG. 10, a predictive recovery scheme that comprises either an FR operation or an RR operation is selected based on which of the operations can be performed in a shorter required amount of time.

In S241, the storage controller 210 estimates respective amounts of time, tFR and tRR, required to recover a UCE using an RF and RR operations, respectively. For example, the storage controller 210 may estimate the amount of time tFR required for the FR operation to be performed with reference to the number of detected error bits or wear-leveling information, read disturbance, and size information of a data chunk. Undoubtedly, actual time required for a previously performed FR operation may also be referred to in estimating tFR.

Further, the storage controller 210 may estimate the amount of time tRR required to recover the detected UCE via performance of the RR operation. Elements for estimating the amount of time tFR required to perform the FR operation and various state information, such as a size of a stripe and type of a parity, for example, may be used in the estimation of the amount of time tRR required to perform the RR operation.

In S243, the estimated amount of time tFR required to perform the FR operation and the estimated amount of time tRR required to perform the RR operation are compared to one another. Based on the result of the comparison, the recovery scheme that is estimated to be performed in the shortest amount of time is selected. In other words, if the amount of time tFR is determined to be shorter than the amount of time tRR (Yes direction), the flow proceeds to S245, whereas if the amount of time tFR is determined to be longer than the amount of time tRR (No direction), the flow proceeds to S247.

In S245, the FR operation is performed to recovery the UCE. Once the FR is finished, the overall predictive recovery operation is complete.

In S247, the RR operation is performed to recover the detected UCE. Once the RR operation is finished, the overall predictive recovery operation is complete.

Figure 11:
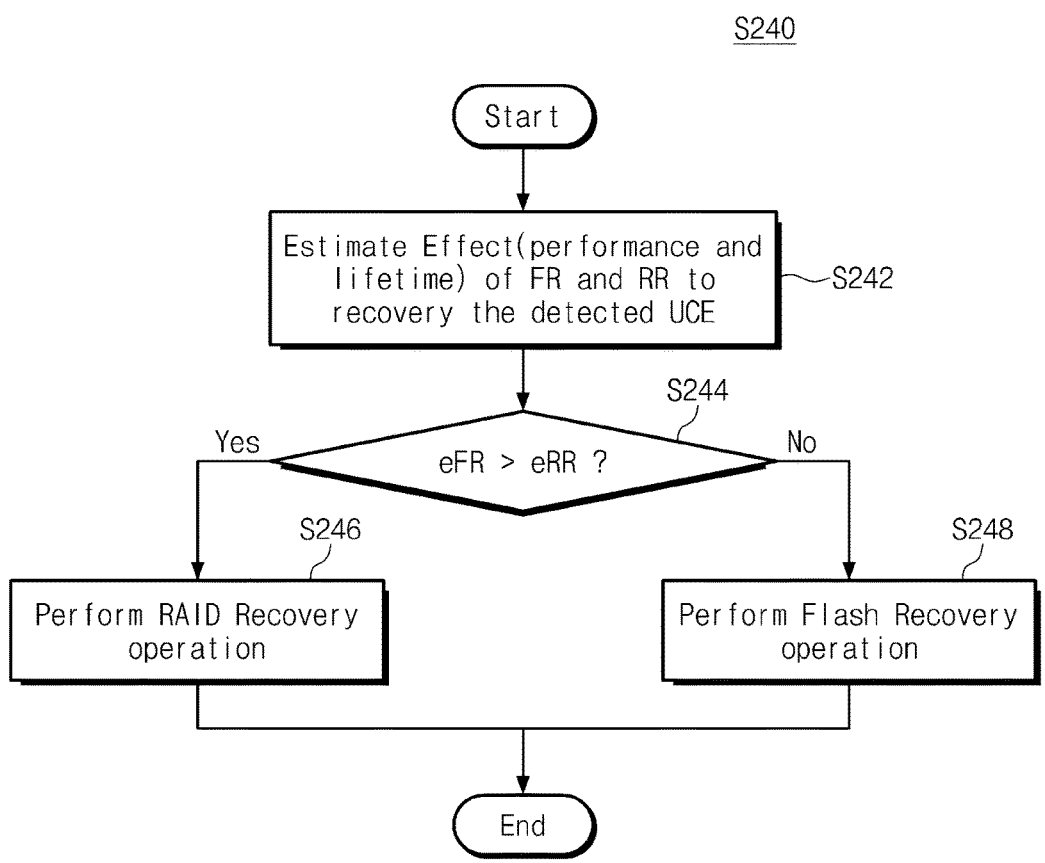
FIG. 11 is a flowchart illustrating another exemplary embodiment of S240 shown in FIG. 9.

FIG. 11 is a flowchart illustrating S240 in FIG. 9 in accordance with another exemplary embodiment. Referring to FIG. 11, one of the FR operation and the RR operation is selected based on an effect such as lifetime of nonvolatile memory devices.

In S242, the storage controller 210 estimates an effect on the nonvolatile memory devices 230, 240, and 250 during recovery of a UCE that occurs. For example, the storage controller 210 may estimate a stress or disturbance applied to memory cells when the detected UCE is recovered via the FR operation or the RR operation. Alternatively, the storage controller 210 may also estimate a shortened lifetime of the memory cells when the detected UCE is recovered via the FR operation. The storage controller 210 may estimate a bad influence or effect on lifetime or performance and use the bad influence or effect to select a recovery operation.

In S244, the estimated effect eFR of the FR operation and the estimated effect eRR of the RR operation are compared with one another. Based on the result of the comparison, one of the two recovery schemes is selected. If the effect eFR resulting from the FR operation is determined to be greater than the effect eRR resulting from the RR operation (Yes direction), the flow proceeds to S246. If the effect eFR resulting from the FR operation is not determined to be greater than the effect eRR resulting from the RR operation (No direction), the flow may proceed to S248.

In S246, the RR operation is performed to recovery the detected UCE. Once the RR operation is finished, the overall predictive recovery operation is complete.

In S248, the FR operation is performed to recover the detected UCE. Once the FR operation is finished, the overall predictive recovery operation is complete.

Figure 12:
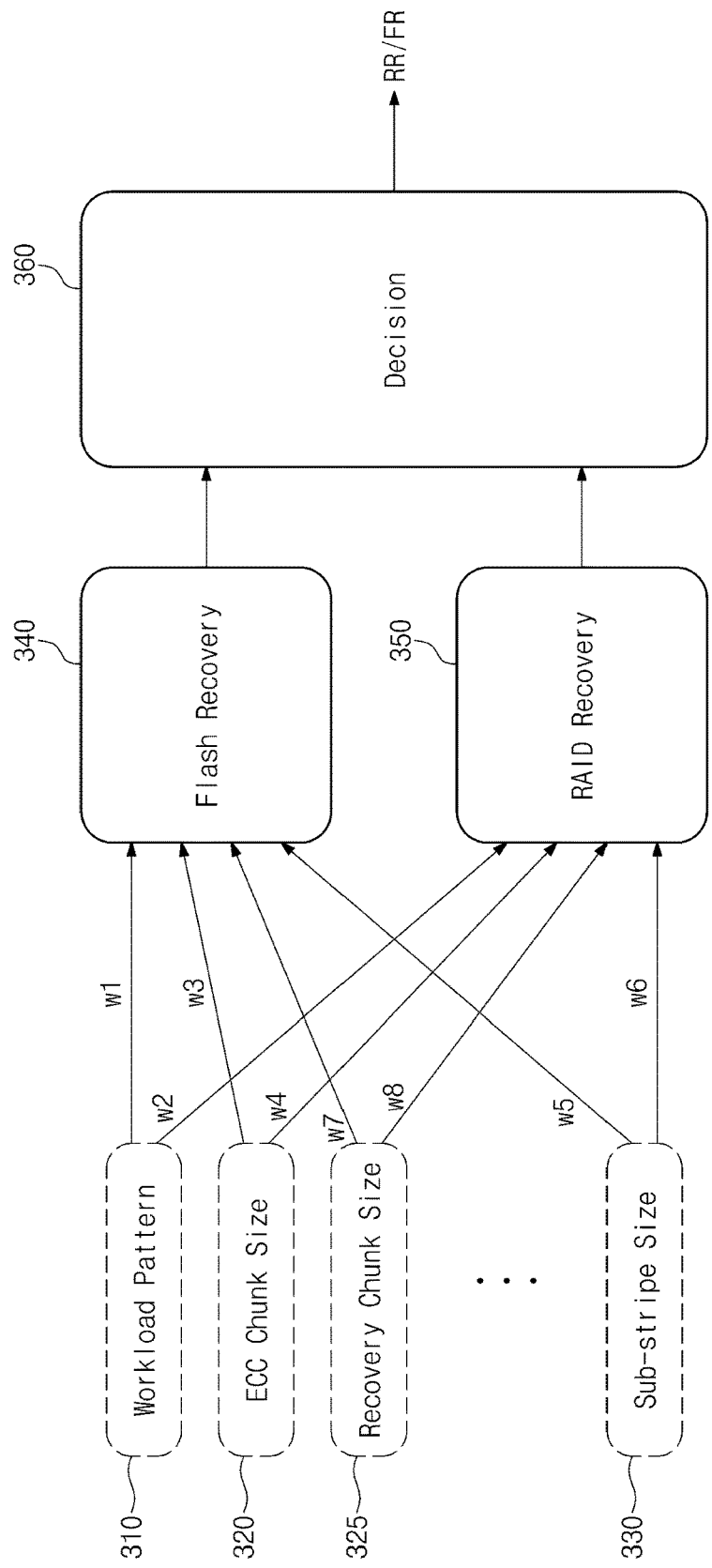
FIG. 12 illustrates a method for determining any one recovery scheme during a predictive recovery operation in accordance with an exemplary embodiment.

FIG. 12 illustrates a method for determining, or selecting, any one recovery scheme to be used during a predictive recovery operation according to an exemplary embodiment. Referring to FIG. 12, various types of information may be provided to select flash recovery 340 and RAID recovery 350. For example, a workload pattern 310 of read-requested data or information such as an ECC chunk size 320, a recovery chunk size 325, and a sub-stripe size 330 may be considered. By combining the various types of information, a weight of each of the various types of information may be applied to select the flash recovery 340 and the RAID recovery 350. For example, a weight w3 on the flash recovery 340 may be set to a greater value than a weight w4 on the RAID recovery 350 while processing the relatively small ECC chunk size 320.

Of the flash recovery 340 and the RAID recovery 350, one of the recovery schemes is selected in a decision block 360 using the above weighted information.

Figure 13:
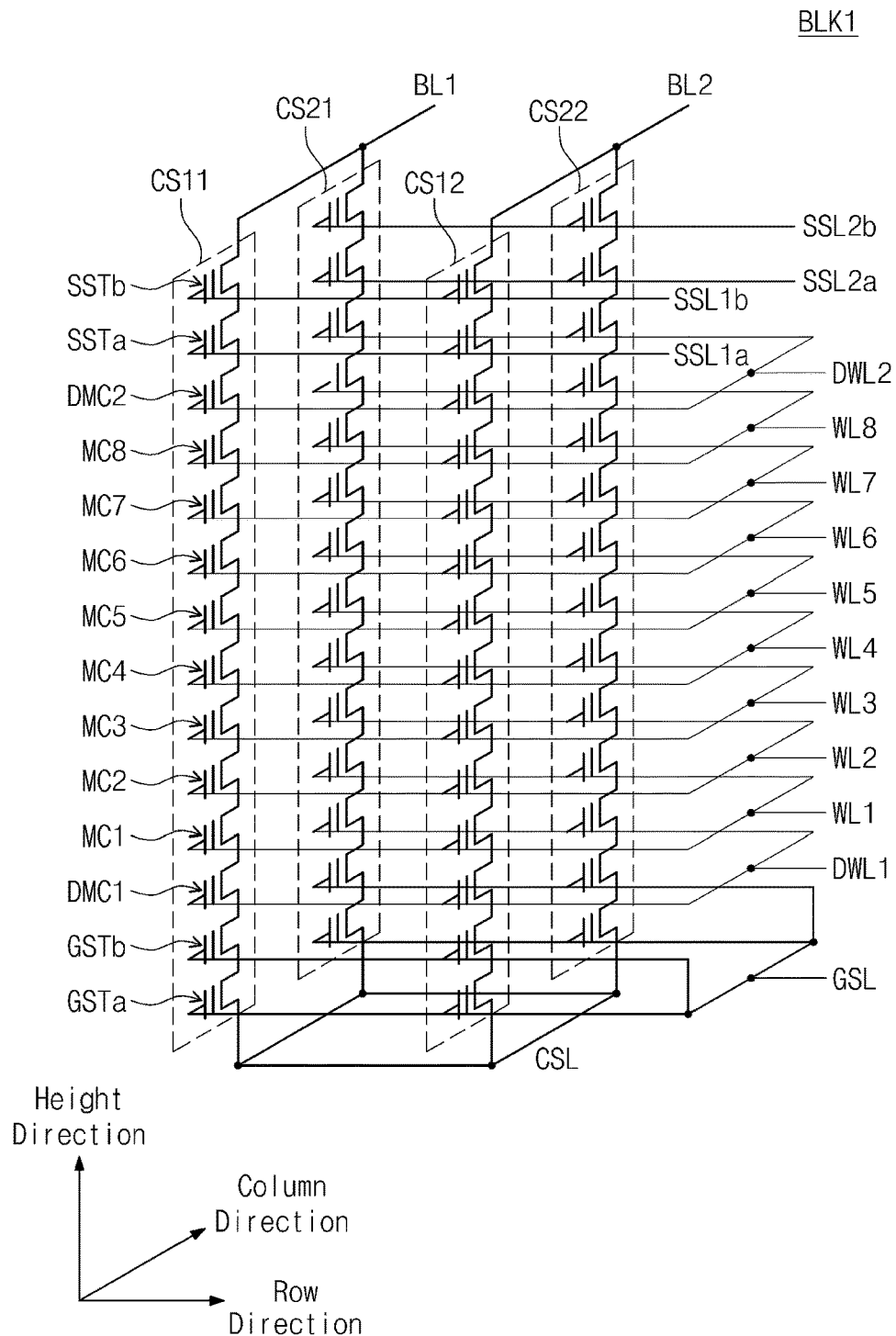
FIG. 13 is a circuit diagram illustrating an example of a first memory block among memory blocks included in a storage in accordance with an exemplary embodiment.

FIG. 13 is a circuit diagram illustrating an example of a first memory block BLK1 among memory blocks included in a storage according to an exemplary embodiment. The first memory block BLK1 has a three-dimensional structure. However, embodiments of the inventive concept are not limited to the first memory block BLK1 having a three-dimensional structure, and each of memory blocks included in a nonvolatile memory may have a similar structure to the first memory block BLK1.

Referring to FIG. 13, the memory block BLK1 includes a plurality of cell strings CS11, CS12, CS21, and CS22. The cell strings CS11, CS12, CS21, and CS22 may be arranged in a row direction and a column direction to form rows and columns.

For example, the cell strings CS11 and CS12 may be connected to string selection lines SSL1a and SSL1b to form a first row. The cell strings CS21 and CS22 may be connected to string selection lines SSL2a and SSL2b to form a second row.

For example, the cell strings CS11 and CS21 may be connected to a first bitline BL1 to form a first column, and the cell strings CS12 and CS22 may be connected to a second bitline BL2 to form a second column.

Each of the cell strings CS11, CS12, CS21, and CS22 may include a plurality of cell transistors. For example, each of the cell strings CS11, CS12, CS21, and CS22 may include string selection transistors SSTa and SSTb, a plurality of memory cells MC1 to MC8, ground selection transistors GSTa and GSTb, and dummy memory cells DMC1 and DMC2. In accordance with an exemplary embodiment, each of the cell transistors included in the cell strings CS11, CS12, CS21, and CS22 is charge trap flash (CTF) memory cell.

The memory cells MC1 to MC8 are serially connected and are stacked in a height direction perpendicular to a plane formed by a row direction and a column direction. The string selection transistors SSTa and SSTb are connected in series, and the serially connected string selection transistors SSTa and SSTb are provided between the memory cells MC1 to MC8 and a bitline BL. The ground selection transistors GSTa and GSTb are serially connected, and the serially connected ground selection transistors GSTa and GSTb are provided between the memory cells MC1 to MC8 and a common source line CSL.

In accordance with an exemplary embodiment, the first dummy cell DMC1 is provided between the memory cells MC1 to MC8 and the ground selection transistors GSTa and GSTb. In accordance with this exemplary embodiment, the second dummy memory cell DMC2 is provided between the memory cells MC1 to MC8 and the string selection transistors SSTa and SSTb.

The ground selection transistors GSTa and GSTb of the cell strings CS11, CS12, CS21, and CS22 may be commonly connected to a ground selection line GSL. In some embodiments, ground selection transistors of the same row are connected to the same ground selection line and ground selection transistors of different rows are connected to different ground selection lines. For example, first ground selection transistors GSTa of cell strings CS11 and CS12 of a first row are connected to a first ground selection line, and first ground selection transistors GSTa of cell strings CS21 and CS22 of a second row are connected to a second ground selection line.

In other embodiments, although not shown in FIG. 13, ground selection transistors provided at the same height from a substrate (not shown) may be connected to the same ground selection line, and ground selection transistors provided at different heights from the substrate may be connected to different ground selection lines. For example, the first ground selection transistors GSTa of the cell strings CS11, CS12, CS21, and CS22 may be connected to a first ground selection line, and the second ground selection transistors GSTb thereof may be connected to a second ground selection line.

Memory cells at the same height from the substrate (or the ground selection transistors GSTa and GSTb) are commonly connected the same wordline, and memory cells at different heights are connected to different wordlines. For example, memory cells MC1 to MC8 of the cell strings CS11, CS12, CS21, and CS22 are commonly connected to first to eighth wordlines WL1 to WL8, respectively.

Among the first string selecting transistors SSTa at the same height, string selection transistors of the same row are connected to the same string selection line and string selection transistors of different rows are connected to different string selection lines. For example, first string selection transistors SSTa of the cell strings CS11 and CS12 of the first row are commonly connected to the string selection line SSL1a, and first string selection transistors SSTa of the cell strings CS21 and CS22 of the second row are commonly connected to the string selection line SSL2a.

Similarly, among the second string selecting transistors SSTb at the same height, string selection transistors of the same row are connected to the same string selection line and string selection transistors of different rows are connected to different string selection lines. For example, second string selection transistors SSTb of the cell strings CS11 and CS12 of the first row are commonly connected to the string selection line SSL1b, and second string selection transistors SSTb of the cell strings CS21 and CS22 of the second row are commonly connected to the string selection line SSL2b.

Although not shown in FIG. 13, string selection transistors of cell strings of the same row may be connected to the same string selection line. For example, first and second string selection transistors SSTa and SSTb of the cell strings CS11 and CS12 of the first row may be commonly connected to the same string selection line. The cell strings CS21 and CS22 and the first and second string selection transistors SSTa and SSTb of the second row may be commonly connected to the same string selection line.

In example embodiments, dummy memory cells at the same height are connected commonly to a same dummy wordline, and dummy memory cells of different heights are connected to different wordlines. For example, first dummy memory cells DMC1 are connected to a first dummy wordline DWL1, and second dummy memory cells DMC2 are connected to a second dummy wordline DWL2.

In the first memory block BLK1, read and write operations may be performed in units of rows. For example, a single row of a memory block BLKa may be selected by the string selection lines SSL1a, SSL1b, SSL2a, and SSL2b. For example, when the string selection lines SSL1a and SSL1b are supplied with a turn-on voltage and the string selection lines SSL2a and SSL2b are supplied with a turn-off voltage, the cell strings CS11 and CS12 of the first row are connected to the bitlines BL1 and BL2. When the string selection lines SSL2a and SSL2b are supplied with a turn-on voltage and the string selection lines SSL1a and SSL1b are supplied with a turn-off voltage, the cell strings CS21 and CS22 of the second row are connected to the bitlines BL1 and BL2 to be driven. Among memory cells of a cell string of a row driven by driving a wordline, memory cells of the same height are selected. Read and write operations may be performed on the selected memory cells. The selected memory cells may form a physical page unit.

In the first memory block BLK1, an erase operation may be performed in units of memory blocks or sub-blocks. When an erase operation is performed in units of memory blocks, all memory cells MC of the first memory block BLK1 are simultaneously erased according to a single erase request. When an erase operation is performed in units of sub-blocks, some of memory cells MC of the first memory block BLK1 are simultaneously erased according to a single erase request and other memory cells MC of the first memory block BLK1 are erase-inhibited. A wordline connected to memory cells to be erased may be supplied with a low voltage (e.g., ground voltage), and a wordline connected to erase-inhibited memory cells may be floated.

The first memory block BLK1 shown in FIG. 13 is merely exemplary. The number of cell strings may increase or decrease, and the number of rows and columns constituted by cell strings may increase or decrease according to the number of the cell strings. Moreover, the number of cell transistors GST, MC, DMC, SST, and the like of the first memory block BLK1 may increase or decrease, and height of the first memory block BLK1 may increase or decrease according to the number of the cell transistors. The number of lines (GSL, WL, DWL, SSL, etc.) connected to the cell transistors may increase or decrease according to the number of the cell transistors.

Figure 14:
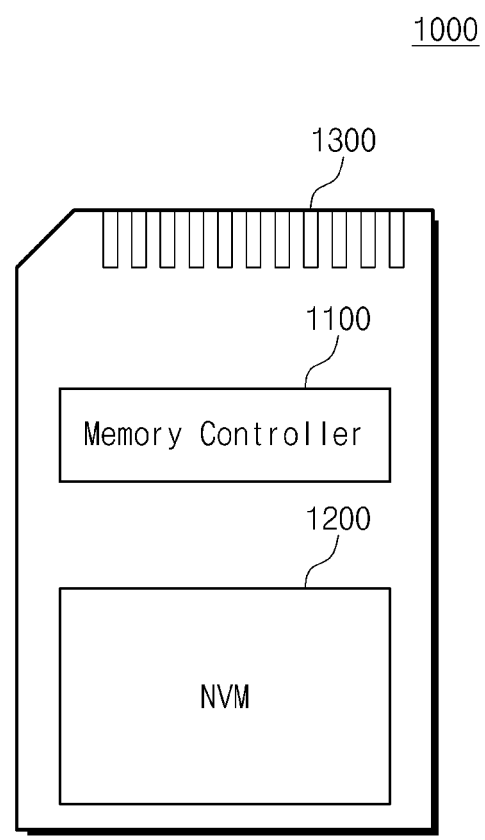
FIG. 14 is a block diagram of a memory card system to which a nonvolatile memory system in accordance with an exemplary embodiment is applied.

FIG. 14 is a block diagram of a memory card system to which a nonvolatile memory system 1000 in accordance with an exemplary embodiment is applied. As illustrated, the memory card system 1000 includes a memory controller 1100, a nonvolatile memory 1200, and a connector 1300.

The memory controller 1100 is connected to the nonvolatile memory 1200. The memory controller 1100 is configured to access the nonvolatile memory 1200. For example, the memory controller 1100 is configured to control read, write, erase, and background operations. The background operations may include operations such as, for example, wear-leveling and garbage collection. In accordance with an exemplary embodiment, similar to the storage controller 210 described with reference to FIGS. 1 and 12, the memory controller 1100 selectively performs an FR operation or an RR operation when a UCE is detected.

The memory controller 1100 is configured to provide an interface between the nonvolatile memory 1200 and the host. The memory controller 1100 is configured to drive firmware for controlling the nonvolatile memory 1200. The memory controller 1100 may include components such as a random access memory (RAM), a processing unit, a host interface, a memory interface, and an error correction unit.

The memory controller 1100 can communicate with an external device via the connector 1300. The controller 1100 can communicate with an external device (e.g., host) using a specific interface protocol. In accordance with an exemplary embodiment, the controller 1100 is configured to communicate with an external device using at least one of various interface protocols such as, for example, Universal Serial Bus (USB), multimedia card (MMC), eMMC (embedded MMC), peripheral component interconnection (PCI), PCI-express (PCIe), Advanced Technology Attachment (ATA), Serial ATA (SATA), Parallel ATA (PATA), Small Computer System Interface (SCSI), Enhanced Small Disk Interface (ESDI), Integrated Drive Electronics (IDE), Firewire, Universal Flash Storage (UFS), and Nonvolatile Memory express (NVMe). In accordance with an exemplary embodiment, a write command defined by the above interface protocols includes size information of write data.

The nonvolatile memory 1200 may be implemented with various nonvolatile memory devices such as electrically erasable and programmable ROM (EPROM), NAND flash memory, NOR flash memory, phase-change RAM (PRAM), resistive RAM (ReRAM), ferroelectric RAM (FRAM), and spin-torque magnetic RAM (STT-MRAM).

In some embodiments, the memory controller 1100 and the nonvolatile memory 1200 are integrated into a single semiconductor device. In some embodiments, the memory controller 1100 and the nonvolatile memory 1200 are integrated into a single semiconductor device to constitute a solid state drive (SSD). The memory controller 1100 and the nonvolatile memory 1200 may be integrated into a single semiconductor device to constitute a memory card. For example, the memory controller 1100 and the nonvolatile memory 1200 may be integrated into a single semiconductor device to constitute a memory card such as, for example, a personal computer memory card international association (PCMCIA), a compact flash card (CF), a smart media card (SM, SMC), a memory stick, a multimedia card (MMC, RS-MMC, and MMCmicro), a SD card (SD, miniSD, and microSD), and a universal flash memory device (UFS).

Figure 15:
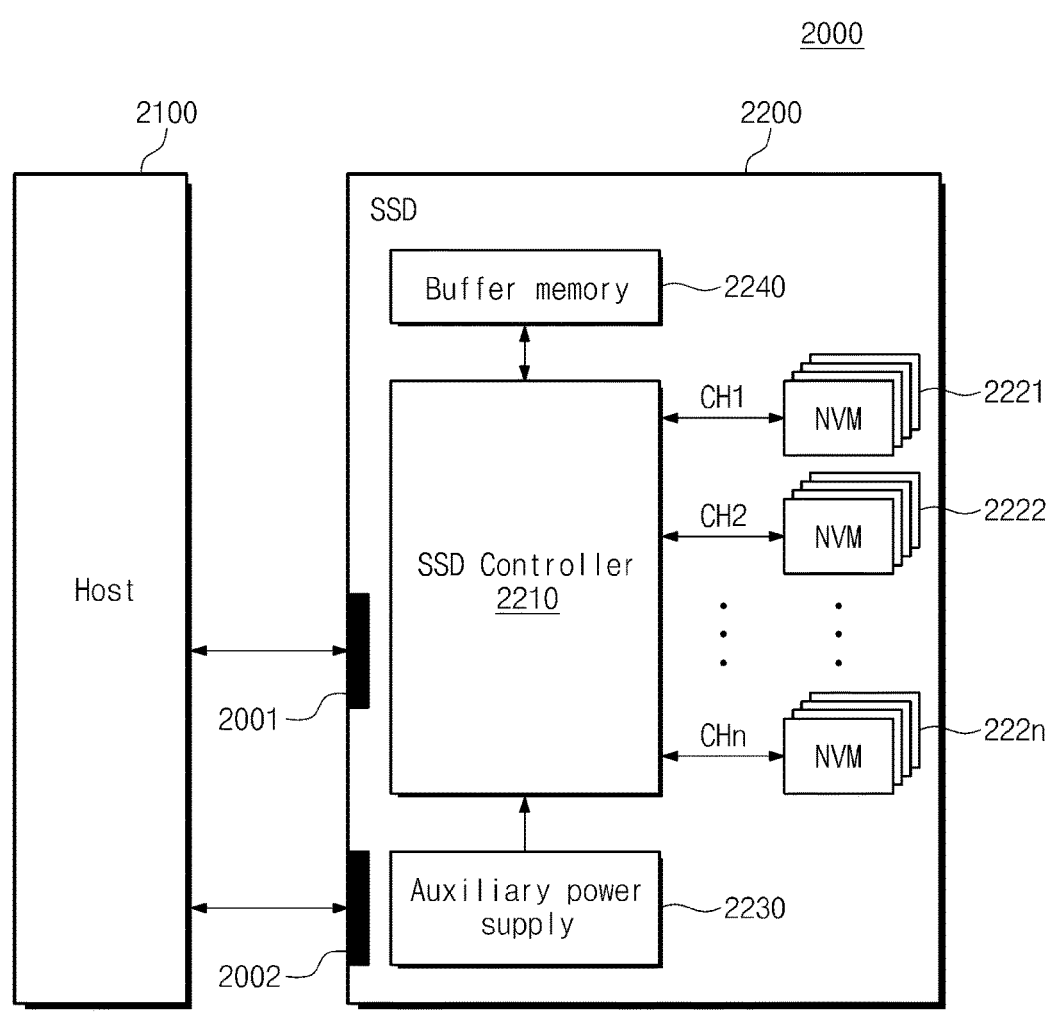
FIG. 15 is a block diagram of a solid state drive (SSD) system to which a nonvolatile memory system in accordance with an exemplary embodiment is applied.

FIG. 15 is a block diagram of a SSD system 2000 that incorporates a nonvolatile memory system according to an exemplary embodiment. As illustrated, the SSD system 2000 includes a host 2100 and an SSD 2200. The SSD 2200 transmits/receives a signal SIG to/from the host 2100 through a signal connector 2001 and is supplied with power PWR through a power connector 2002. The SSD 2200 includes an SSD controller 2210, a plurality of flash memories 2221 to 222n, an auxiliary power supply 2230, and a buffer memory 2240.

The SSD controller 2210 may control the flash memories 2221 to 222n in response to the signal SIG received from the host 2100. In accordance with an exemplary embodiment, similar to the storage controller 210 described with reference to FIGS. 1 and 12, the SSD controller 2210 selectively performs one of an FR operation and an RR operation when a UCE is detected.

The auxiliary power supply 2230 is connected to the host 2100 through the power connector 2002. The auxiliary power supply 2230 may be supplied with the power PWR from the host 2100. The auxiliary power supply 2230 may supply power of the SSD system 2000 when power is not sufficiently supplied from the host 2100. The auxiliary power supply 2230 may be disposed inside or outside the SSD 2200. For example, the auxiliary power supply 2230 may be disposed on a mainboard and may supply auxiliary power to the SSD 2200.

The buffer memory 2240 operates as a buffer memory of the SSD 2200. For example, the buffer memory 2240 may temporarily store data received from the host 2100 or data received from the flash memories 2221 to 222n, or may temporarily store metadata (e.g., mapping table) of the flash memories 2221 to 222n. The buffer memory 2240 may include a nonvolatile memory such as DRAM, SDRAM, double data rate (DDR) SDRAM, low power double data rate (LPDDR) SDRAM, and SRAM and nonvolatile memories such as FRAM, ReRAM, STT-MRAM, and PRAM.

Figure 16:
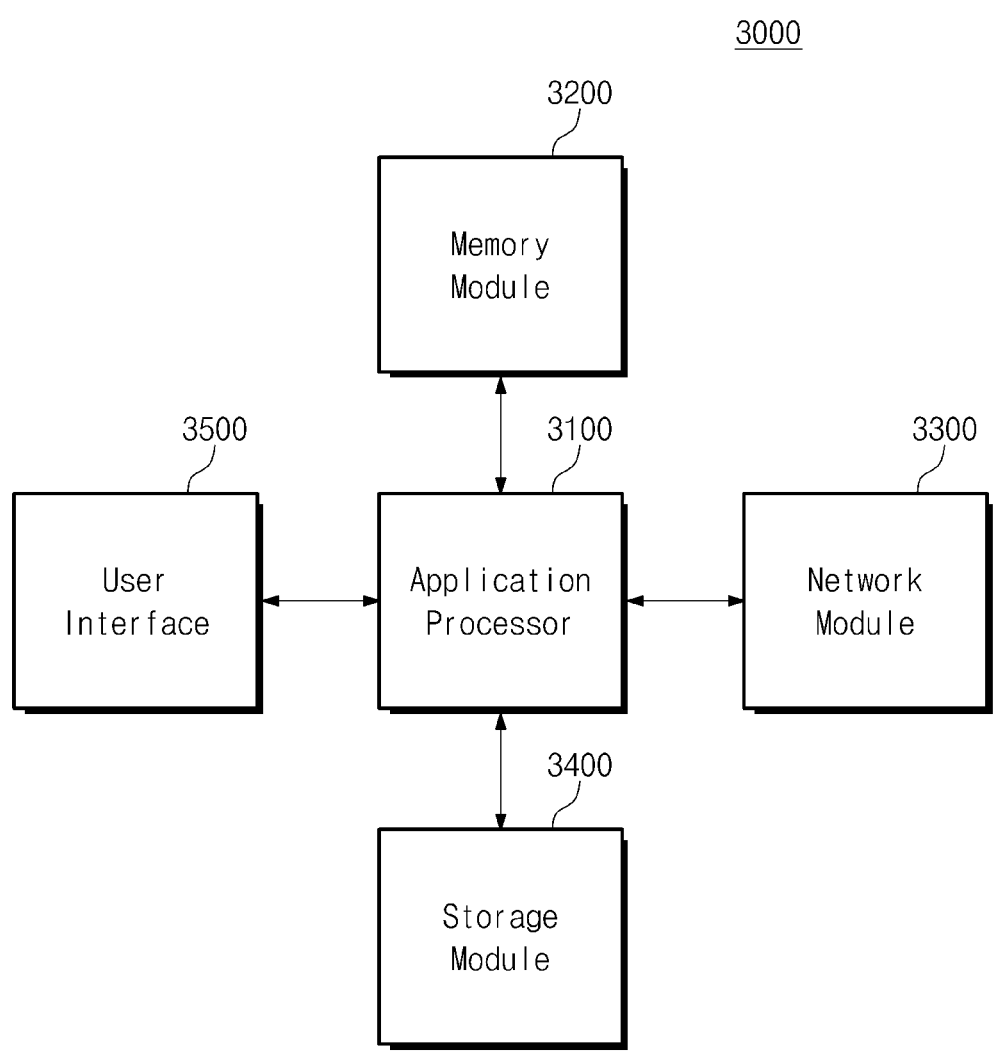
FIG. 16 is a block diagram of a user system to which a nonvolatile memory system in accordance with an exemplary embodiment is applied.

FIG. 16 is a block diagram of a user system 3000 that incorporates a nonvolatile memory system in accordance with exemplary embodiments described herein. As illustrated, the user system 3000 includes an application processor 3100, a memory module 3200, a network module 3300, a storage module 3400, and a user interface 3500.

The application processor 3100 may drive components included in the user system 3000 and an operating system (OS). The application processor 3100 may include controllers to control the components included in the user system 3000, interfaces, and a graphic engine. The application processor 3100 may be provided as a system-on-chip (SoC).

The memory module 3200 may operate as a main memory, a working memory, a buffer memory or a cache memory of the user system 3000. The memory module 3200 may include, for example, a volatile random access memory such as DRAM, SDRAM, DDR SDRAM, DDR2 SDRAM, DDR3 SDRAM, LPDDR SDRAM, LPDDR2 SDRAM, and LPDDR3 SDRAM or a nonvolatile random access memory such as PRAM, ReRAM, MRAM, and FRAM.

The network module 3300 may communicate with external devices. For example, the network module 3300 may support wireless communication protocols such as, for example, Code Division Multiple Access (CDMA), Global System for Mobile communication (GSM), wideband CDMA (WCDMA), CDMA-2000, Time Division Multiple Access (TDMA), Long Term Evolution (LTE), Worldwide Interoperability for Microwave Access (Wimax), wireless local area network (WLAN), Ultra-wideband (UWB), Bluetooth, and Wireless Display (WI-DI). In an exemplary embodiment, the network module 3300 is included in the application processor 3100.

The storage module 3400 may store data. For example, the storage module 3400 may store data received from the application processor 3100. Alternatively, the storage module 3400 may transmit data stored in the storage module 3400 to the application processor 3100. The storage module 3400 may be implemented using nonvolatile semiconductor memory devices such as phase-change RAMs (PRAMs), magnetic RAMs (MRAMs), resistive RAMs (ReRAMs), NAND flash memories, NOR flash memories, and three-dimensional (3D) NAND flash memories.

The storage module 3400 may perform a recovery operation described with reference to FIGS. 1 to 12. The storage module 3400 may perform FR and RR operations selectively or simultaneously when a UCE is detected.

The storage module 3400 may communicate with the application processor 3100 based on a predetermined interface. The storage module 3400 may adjust execution time of garbage collection based on a write command received from the application processor 3100.

The user interface 3500 may include interfaces that input data or a command to the application processor 3100 or output data to an external device. For example, the user interface 3500 may include user input interfaces such as, for example, a keyboard, a keypad, a button, a touch panel, a touch screen, a touch pad, a touch ball, a camera, a microphone, a gyroscope sensor, and a vibration sensor. The user interface 3500 may include user output interfaces such as, for example, a liquid crystal display (LCD), an organic light emitting diode (OLED) display, an active matrix OLED (AMOLED), an LED, a speaker, and a monitor.

According to exemplary embodiments described above, a recovery method is provided that minimizes the amount of time that is required to perform recovery when a UCE occurs. Moreover, a RAID storage device is provided with high data reliability with respect to a UCE according to a selected recovery procedure.

The above-disclosed subject matter is to be considered illustrative or exemplary, and not restrictive, and the appended claims are intended to cover a variety of modifications, enhancements, and other features that fall within the true spirit and scope of inventive concepts. Thus, to the maximum extent allowed by law, the scope of inventive concepts is to be determined by the broadest permissible interpretation of the following claims and their equivalents, and shall not be restricted or limited by the foregoing detailed description. While some example embodiments have been particularly shown and described, it will be understood by one of ordinary skill in the art that variations in form and detail may be made without departing from the spirit and scope of the claims.

What is claimed is:

1. A recovery method of a redundant array of independent disks (RAID) storage device including a plurality of nonvolatile memory devices, the recovery method comprising:
   reading a data chunk, in which an uncorrectable error occurs, from the plurality of nonvolatile memory devices;
   selecting a plurality of sub-stripes including a parity and excluding the data chunk; and
   performing, in parallel, a first recovery operation of adjusting a read level to recover the data chunk and a second recovery operation of processing the plurality of sub-stripes to recover a sub-stripe including the data chunk,
   wherein a completion of one of the first recovery operation and the second recovery operation earlier in time than the other of the first recovery operation and the second recovery operation constitutes a completion of the recovery method.

2. The recovery method as set forth in claim 1, wherein each of the plurality of nonvolatile memory devices is a chip or a die-level storage device.

3. The recovery method as set forth in claim 1, wherein the first recovery operation includes an operation of repeatedly reading the data chunk from the plurality of nonvolatile memory devices under different bias conditions.

4. The recovery method as set forth in claim 1, wherein the second recovery operation generates a logic value of a sub-stripe including the data chunk by using the plurality of sub-stripes and the parity.

5. The recovery method as set forth in claim 1, wherein completion of the second recovery operation is checked one or more times during the first recovery operation.

6. The recovery method as set forth in claim 5, wherein completion of the first recovery operation is checked one or more times during the second recovery operation.

7. The recovery method as set forth in claim 1, wherein at one of the plurality of nonvolatile memory devices includes a three-dimensional memory array.

8. An apparatus for performing a data recovery operation in a redundant array of independent disks (RAID) storage device that includes a plurality of nonvolatile memory devices, the apparatus comprising:
   a storage controller configured to execute instructions, wherein, when executed by the storage controller the instructions cause the apparatus to implement a process comprising:
   reading a data chunk, in which an uncorrectable error occurs, from the plurality of nonvolatile memory devices;
   selecting a plurality of sub-stripes including a parity and excluding the data chunk; and
   performing in parallel a first recovery operation and a second recovery operation, wherein the first recovery operation comprises adjusting a read level to recover the data chunk and the second recovery operation comprises processing the plurality of sub-stripes to recover a sub-stripe including the data chunk,
   wherein a completion of either of the first recovery operation and the second recovery operation constitutes a completion of the data recovery operation.

9. The apparatus of claim 8, wherein the first recovery operation includes an operation of repeatedly reading the data chunk from the plurality of nonvolatile memory devices under different bias conditions.

10. The apparatus of claim 8, wherein the second recovery operation generates a logic value of a sub-stripe including the data chunk by using the plurality of sub-stripes and the parity.

11. The apparatus of claim 8, wherein the performing in parallel the first recovery operation and the second recovery operation comprises checking at least one time completion of the second recovery operation during performance of the first recovery operation.

12. The apparatus of claim 11, wherein the performing in parallel the first recovery operation and the second recovery operation comprises checking at least one time completion of the first recovery operation during performance of the second recovery operation.

* * * * *